(12) United States Patent
Thareja et al.

(10) Patent No.: US 11,641,747 B2
(45) Date of Patent: *May 2, 2023

(54) INTEGRATION OF A FERROELECTRIC MEMORY DEVICE WITH A TRANSISTOR

(71) Applicant: Kepler Computing Inc., San Francisco, CA (US)

(72) Inventors: Gaurav Thareja, Santa Clara, CA (US); Sasikanth Manipatruni, Portland, OR (US); Rajeev Kumar Dokania, Beaverton, OR (US); Ramamoorthy Ramesh, Moraga, CA (US); Amrita Mathuriya, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/654,521

(22) Filed: Mar. 11, 2022

(65) Prior Publication Data
US 2022/0199633 A1   Jun. 23, 2022

Related U.S. Application Data

(63) Continuation of application No. 16/729,273, filed on Dec. 27, 2019, now Pat. No. 11,289,497.

(51) Int. Cl.
*H01L 27/11507* (2017.01)
*H01L 49/02* (2006.01)
*G11C 11/22* (2006.01)

(52) U.S. Cl.
CPC ...... *H01L 27/11507* (2013.01); *G11C 11/221* (2013.01); *H01L 28/56* (2013.01)

(58) Field of Classification Search
CPC .. H01L 27/11507; H01L 28/56; G11C 11/221
See application file for complete search history.

(56) References Cited

U.S. PATENT DOCUMENTS

| | | |
|---|---|---|
| 5,479,317 A | 12/1995 | Ramesh |
| 5,519,235 A | 5/1996 | Ramesh |
| 5,651,857 A | 7/1997 | Cronin et al. |

(Continued)

FOREIGN PATENT DOCUMENTS

| | | |
|---|---|---|
| GB | 2323188 A | 9/1998 |
| JP | 10242426 | 9/1998 |

(Continued)

OTHER PUBLICATIONS

Chandler, T. "An adaptive reference generation scheme for 1T1C FeRAMs", 2003 Symposium on VLSI Circuits. Digest of Technical Papers (IEEE Cat. No.03CH37408), Kyoto, Japan, 2003, pp. 173-174.

(Continued)

*Primary Examiner* — Allison Bernstein
(74) *Attorney, Agent, or Firm* — Mughal IP P.C.

(57) ABSTRACT

Approaches for integrating FE memory arrays into a processor, and the resulting structures are described. Simultaneous integrations of regions with ferroelectric (FE) cells and regions with standard interconnects are also described. FE cells include FE capacitors that include a FE stack of layers, which is encapsulated with a protection material. The protection material protects the FE stack of layers as structures for regular logic are fabricated in the same die.

19 Claims, 13 Drawing Sheets

(56) References Cited

U.S. PATENT DOCUMENTS

| | | | |
|---|---|---|---|
| 5,716,875 | A | 2/1998 | Jones, Jr. et al. |
| 5,777,356 | A | 7/1998 | Dhote et al. |
| 6,066,868 | A | 5/2000 | Evans, Jr. |
| 6,115,281 | A | 9/2000 | Aggarwal et al. |
| 6,117,688 | A | 9/2000 | Evans, Jr. et al. |
| 6,194,754 | B1 | 2/2001 | Aggarwal et al. |
| 6,211,035 | B1 | 4/2001 | Moise et al. |
| 6,274,388 | B1 | 8/2001 | Aggarwal et al. |
| 6,344,413 | B1 | 2/2002 | Zurcher et al. |
| 6,346,741 | B1 | 2/2002 | Buskirk et al. |
| 6,440,815 | B1 | 8/2002 | Mitsuhashi |
| 6,587,367 | B1 | 7/2003 | Nishimura et al. |
| 6,656,748 | B2 | 12/2003 | Hall et al. |
| 6,713,342 | B2 | 3/2004 | Celii et al. |
| 6,720,600 | B2 | 4/2004 | Okita |
| 6,728,128 | B2 | 4/2004 | Nishimura et al. |
| 7,029,925 | B2 | 4/2006 | Celii et al. |
| 7,435,683 | B2 | 10/2008 | Kavalieros et al. |
| 7,935,543 | B2 | 5/2011 | Moise, IV et al. |
| 8,183,109 | B2 | 5/2012 | Izumi et al. |
| 8,362,533 | B2 | 1/2013 | Ozaki |
| 9,991,270 | B2 | 6/2018 | Wang |
| 2003/0119211 | A1 | 6/2003 | Summerfelt et al. |
| 2004/0135182 | A1 | 7/2004 | An et al. |
| 2008/0038846 | A1 | 2/2008 | Park et al. |
| 2008/0224194 | A1 | 9/2008 | Sashida |
| 2008/0265298 | A1 | 10/2008 | Ozaki |
| 2009/0008743 | A1 | 1/2009 | Lee et al. |
| 2009/0298201 | A1 | 12/2009 | Nagai |
| 2010/0320518 | A1 | 12/2010 | Ozaki |
| 2012/0107965 | A1 | 5/2012 | Sashida |
| 2013/0264620 | A1 | 10/2013 | Yu et al. |
| 2015/0072441 | A1 | 3/2015 | Sun |
| 2016/0225423 | A1 | 8/2016 | Naik et al. |
| 2017/0287920 | A1 | 10/2017 | Wang |
| 2019/0027535 | A1 | 1/2019 | Kumar et al. |
| 2019/0259807 | A1 | 8/2019 | Kumar et al. |
| 2020/0105772 | A1 | 4/2020 | Chen et al. |
| 2021/0111333 | A1 | 4/2021 | Chang et al. |

FOREIGN PATENT DOCUMENTS

| | | |
|---|---|---|
| TW | 200403814 A | 3/2004 |
| TW | 201241936 A | 10/2012 |
| TW | 201526206 A | 7/2015 |
| TW | 201715707 A | 5/2017 |
| TW | 201830585 A | 8/2018 |
| TW | 201830664 A | 8/2018 |
| TW | 201915624 A | 4/2019 |
| TW | 201917870 A | 5/2019 |
| TW | 201946052 A | 12/2019 |
| TW | 201946218 A | 12/2019 |
| WO | 2012078162 A1 | 6/2012 |

OTHER PUBLICATIONS

International Search Report & Written Opinion notified Apr. 15, 2021 for PCT Patent Application No. PCT/US2020/066950.
International Search Report & Written Opinion notified Apr. 21, 2021 for PCT Patent Application No. PCT/US2020/066955.
International Search Report & Written Opinion notified Apr. 22, 2021 for PCT Patent Application No. PCT/US2020/066958.
Jung, D. et al., "Highly manufacturable 1T1C 4 Mb FRAM with novel sensing scheme," International Electron Devices Meeting 1999. Technical Digest (Cat. No. 99CH36318), Washington, DC, USA, 1999, pp. 279-282. , International Electron Devices Meeting 1999. Technical Digest (Cat. No.99CH36318), Washington, DC, USA, 1999, pp. 279-282.
Muller, J. et al., "Ferroelectric Hafnium Oxide Based Materials and Devices: Assessment of Current Status and Future Prospects", ECS Journal of Solid State Science and Technology, 4 (5) N30-N35 (215). 6 pages.
Non-Final Office Action notified Aug. 3, 2021 for Taiwanese Patent Application No. 109146059.
Non-Final Office Action notified Jan. 26, 2022 for U.S. Appl. No. 16/729,278.
Non-Final Office Action notified Jul. 8, 2021 for U.S. Appl. No. 16/729,267.
Final Office Action notified Mar. 9, 2022 for U.S. Appl. No. 16/795,404.
Non-Final Office Action notified Oct. 28, 2021 for U.S. Appl. No. 16/795,04.
Notice of Allowance notified Jan. 5, 2022 for U.S. Appl. No. 16/729,273.
Notice of Allowance notified Mar. 11, 2022 for U.S. Appl. No. 16/729,267.
Office Action notified Nov. 2, 2021 for Taiwan Patent Application No. 109146058.
Office Action notified Sep. 6, 2021 for Taiwan Patent Application No. 109146060.
Ogiwara, R. et al., "A 0.5-/spl mu/m, 3-V 1T1C, 1-Mbit FRAM with a variable reference bit-line voltage scheme using a fatigue-free reference capacitor", in IEEE Journal of Solid-State Circuits, vol. 35, No. 4, pp. 545-551, Apr. 2000.
Oh, S. et al. "Noble FeRAM technologies with MTP cell structure and BLT ferroelectric capacitors", IEEE International Electron Devices Meeting 2003, Washington, DC, USA, 2003, p. 34.5.1-34.5.4.
Restriction Requirement notified Mar. 26, 2021 for U.S. Appl. No. 16/729,267.
Restriction Requirement notified Nov. 9, 2021 for U.S. Appl. No. 16/729,278.
Second Office Action notified Feb. 21, 2022 for Taiwan Patent Application No. 109146058.
Second Office Action notified Mar. 10, 2022 for Taiwan Patent Application No. 109146059.
Subbarao, E., "Ferroelectric and antiferroelectric materials", Department of Metallurgical Engineering, Indian Institute of Technology, Kanpur, IN. First published Mar. 15, 2011. Ferroelectrics, 5:1, 267-280.
Tanaka, S. et al., "FRAM cell design with high immunity to fatigue and imprint for 0.5/spl mu/m 3 V 1T1C 1 Mbit FRAM", in IEEE Transactions on Electron Devices, vol. 47, No. 4, pp. 781-788, Apr. 2000.
Yamaoka, K. et al., "A 0.9-V 1T1C SBT-based embedded nonvolatile FeRAM with a reference voltage scheme and multilayer shielded bit-line structure", in IEEE Journal of Solid-State Circuits, vol. 40, No. 1, pp. 286-292, Jan. 2005.
Advisory Action notified May 20, 2022 for U.S. Appl. No. 17/795,404.
International Preliminary Report on Patentability notified Jul. 7, 2022 for PCT Patent Application No. PCT/2020/066958.
International Preliminary Report on Patentability notified Jul. 7, 2022 for PCT Patent Application No. PCT/US2020/066950.
International Preliminary Report on Patentability notified Jul. 7, 2022 for PCT Patent Application No. PCT/US2020/066955.
Non Final Office Action notified Jun. 8, 2022 for U.S. Appl. No. 16/729,267.
Notice of Allowance (2) notified Jun. 27, 2022 for U.S. Appl. No. 16/729,267.
Notice of Allowance notified Apr. 28, 2022 for Taiwan Patent Application No. 109146060.
Notice of Allowance notified Jun. 9, 2022 for U.S. Appl. No. 16/729,278.
Notice of Allowance notified May 24, 2022 for Taiwan Patent Application No. 109146058.
Second Office Action notified Apr. 11, 2022 for TW Patent Application No. 109146059.
Non-Final Office Action notified Aug. 18, 2022 for U.S. Appl. No. 16/795,404.
Notice of Allowance notified Aug. 29, 2022 for Taiwan Patent Application No. 109146059.
Notice of Allowance notified Oct. 3, 2022 for U.S. Appl. No. 16/795,404.
LexInnova, 3D Stacked Memory, retrieved from the Internet by USPTO at. 2017. 23 pages.

(56) References Cited

OTHER PUBLICATIONS

Non-Final Office Action notified Feb. 2, 2023 for U.S. Appl. No. 17/663,187.
Non-Final Office Action notified Mar. 3, 2023 for U.S. Appl. No. 17/449,240.
Non-Final Office Action notified Mar. 13, 2023 for U.S. Appl. No. 17/345,964.
Non-Final Office Action notified Mar. 13, 2023 for U.S. Appl. No. 17/346,094.
Non-Final Office Action notified Mar. 14, 2023 for U.S. Appl. No. 17/346,090.
Wikipedia. Ferroelectric RAM. retrieved from the Internet by USPTO at, 2020, 8 pages.

INTEGRATION OF A FERROELECTRIC MEMORY DEVICE WITH A TRANSISTOR

CLAIM OF PRIORITY

This Application is a Continuation of, and claims the benefit of priority to, U.S. patent application Ser. No. 16/729,273, filed Dec. 27, 2019, and now issued as U.S. Pat. No. 11,289,497 on Mar. 29, 2022, and which is incorporated by reference in its entirety for all purposes.

BACKGROUND

The standard memory used in processors is static random access memory (SRAM) or dynamic random access memory (DRAM), and their derivatives. These memories are volatile memories. For example, when power to the memories is turned off, the memories lose their stored data. Non-volatile memories are now also commonly used in computing platforms to replace magnetic hard disks. Non-volatile memories retain their stored data for prolonged periods (e.g., months, years, or forever) even when power to those memories is turned off. Examples of non-volatile memories are magnetic random access memory (MRAM), NAND or NOR flash memories. These memories may not be suitable for low power and compact computing devices because these memories suffer from high write energy, low density, and high power consumption.

The background description provided here is for the purpose of generally presenting the context of the disclosure. Unless otherwise indicated here, the material described in this section is not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
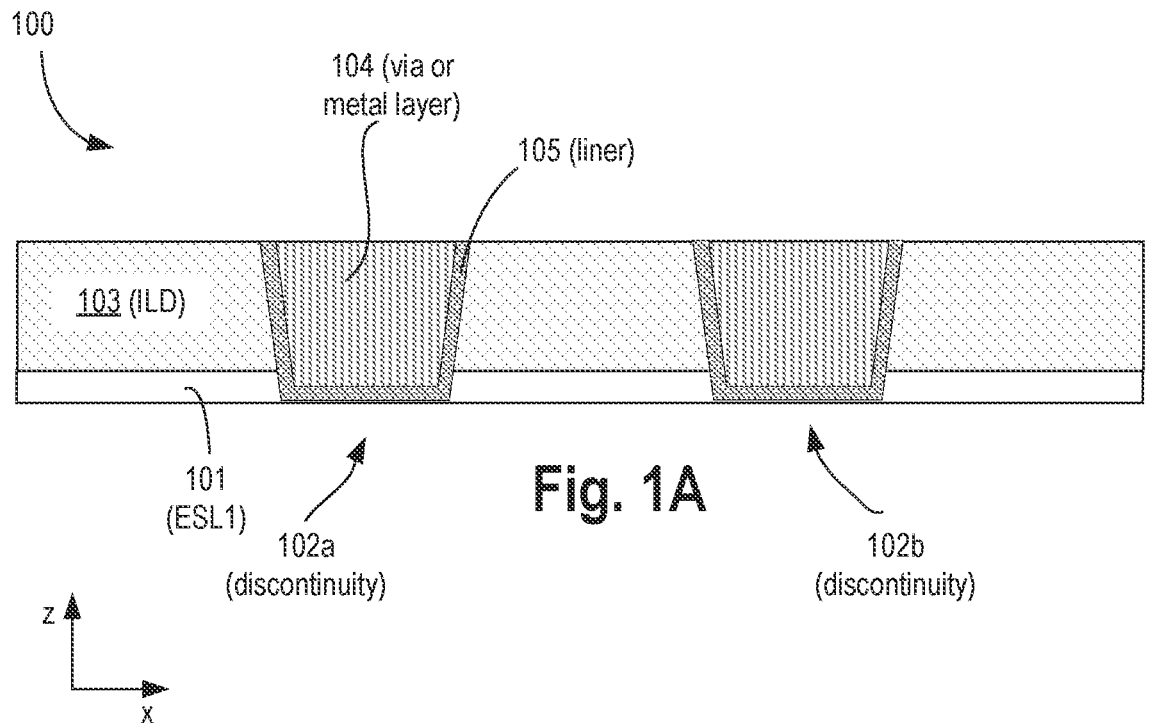
FIGS. 1A-N illustrate cross-sections of processes of patterning and integrating a ferroelectric capacitor with a transistor, in accordance with some embodiments.
Figure 1B:
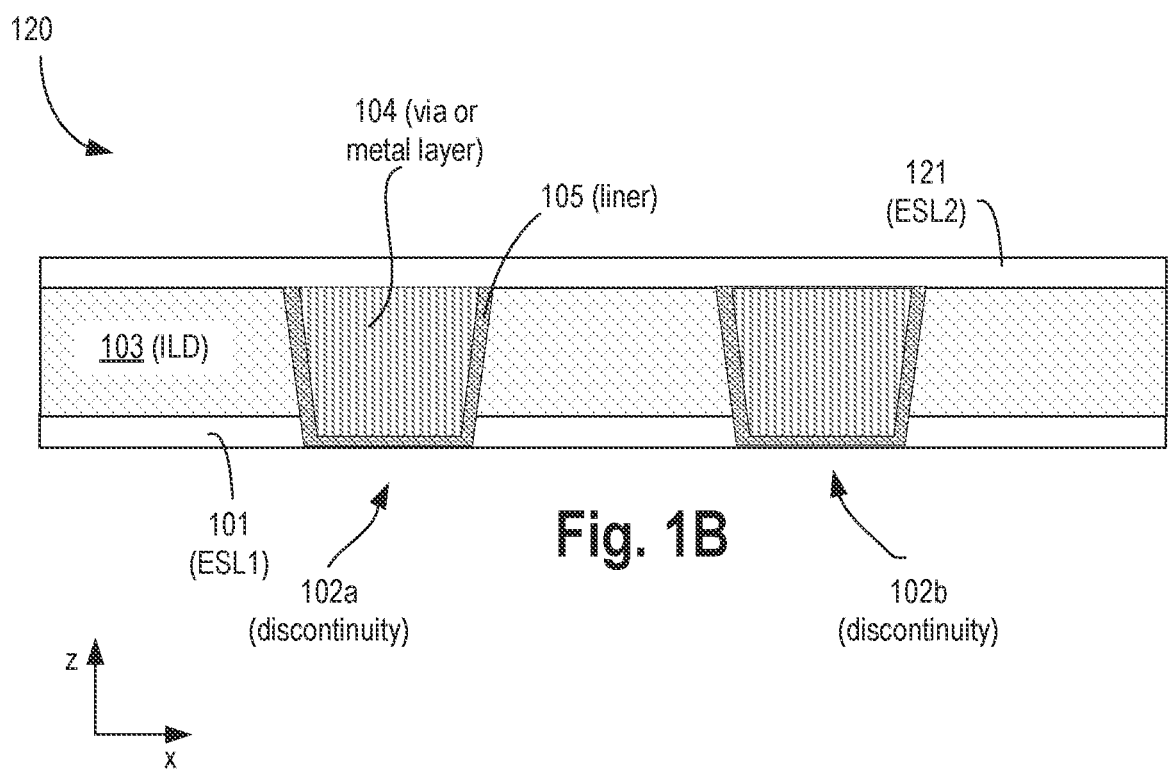
Figure 1C:
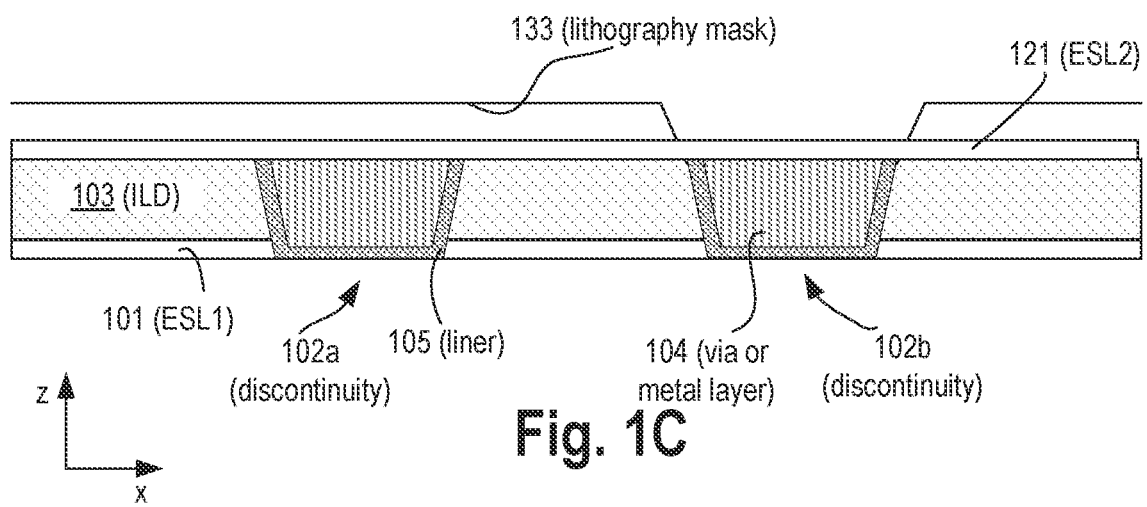
Figure 1D:
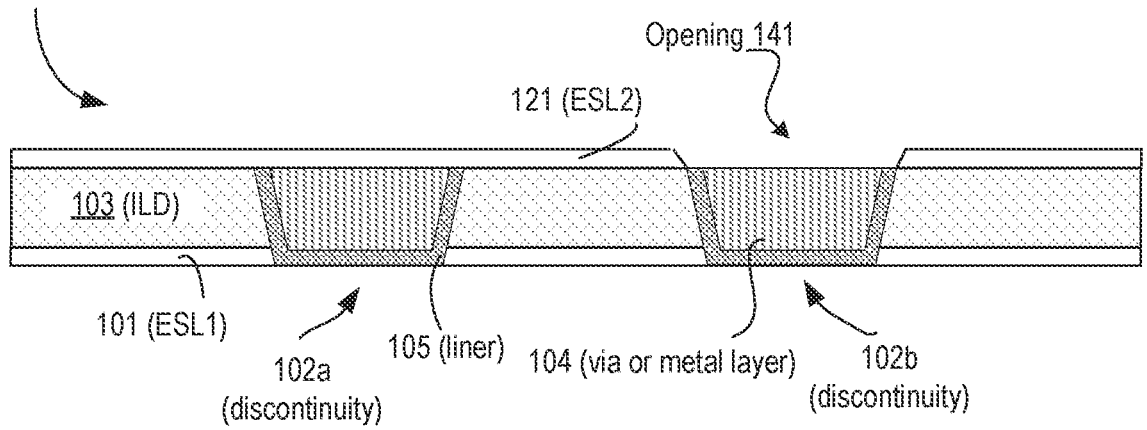
Figure 1E:
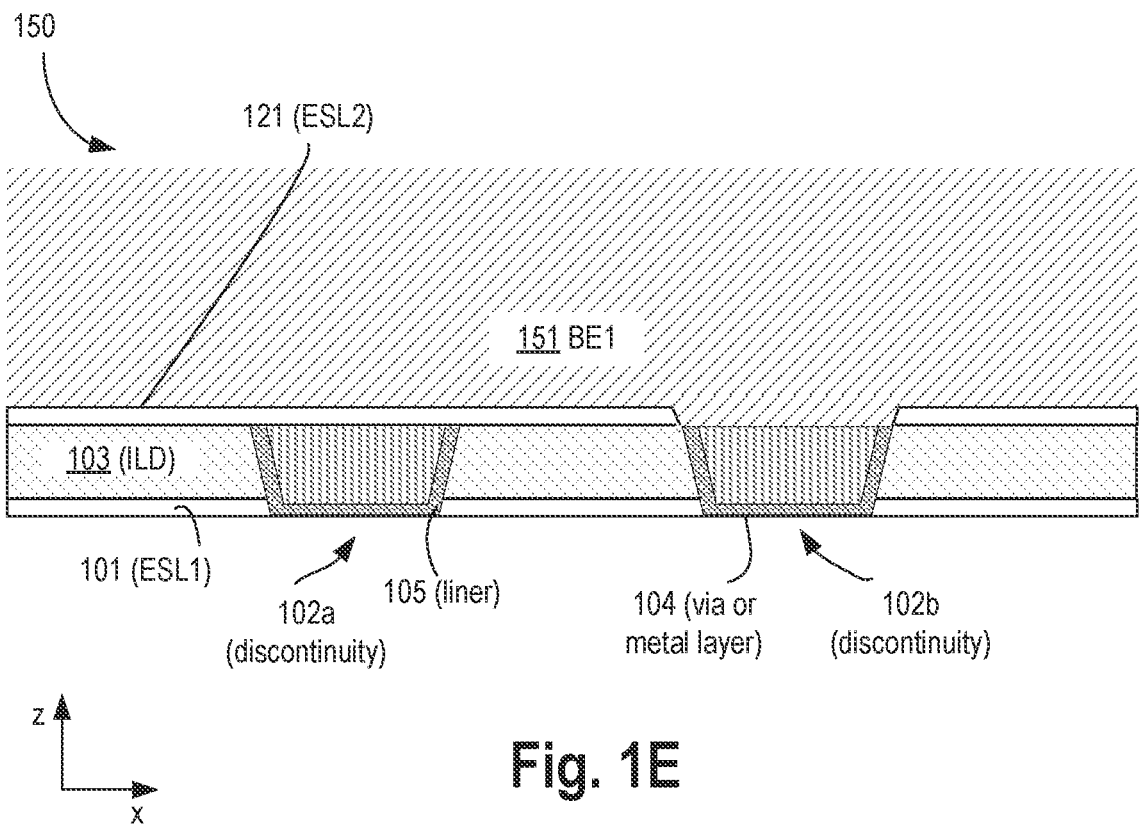
Figure 1F:
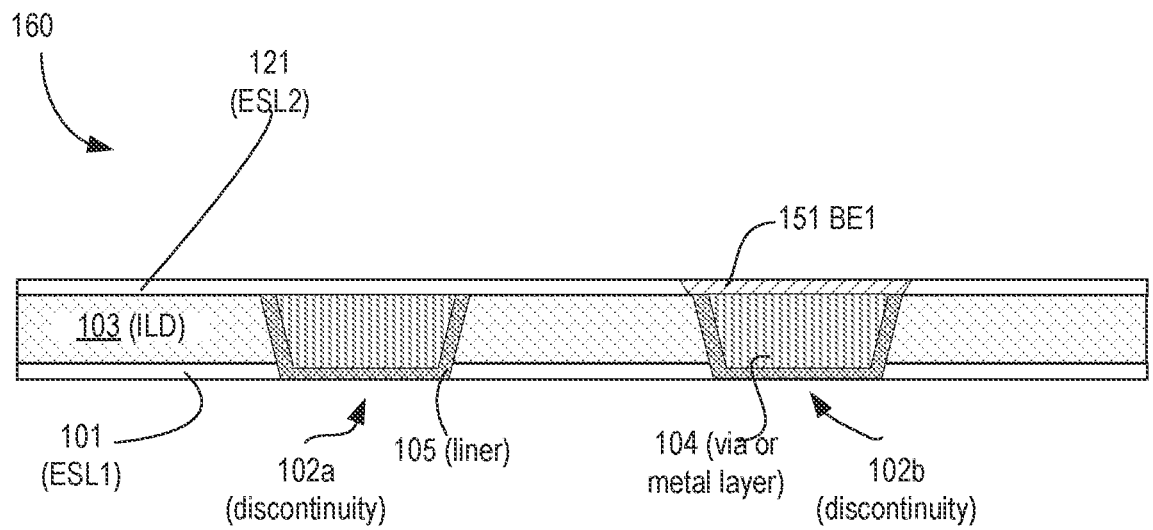
Figure 1G:
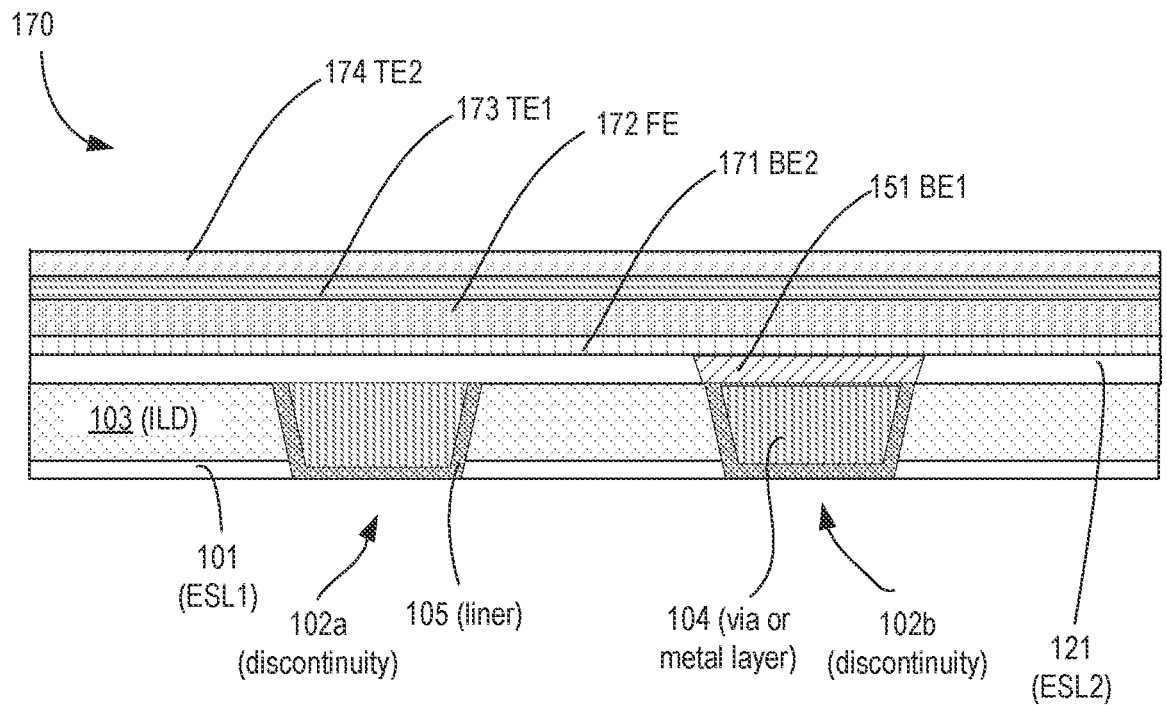
Figure 1H:
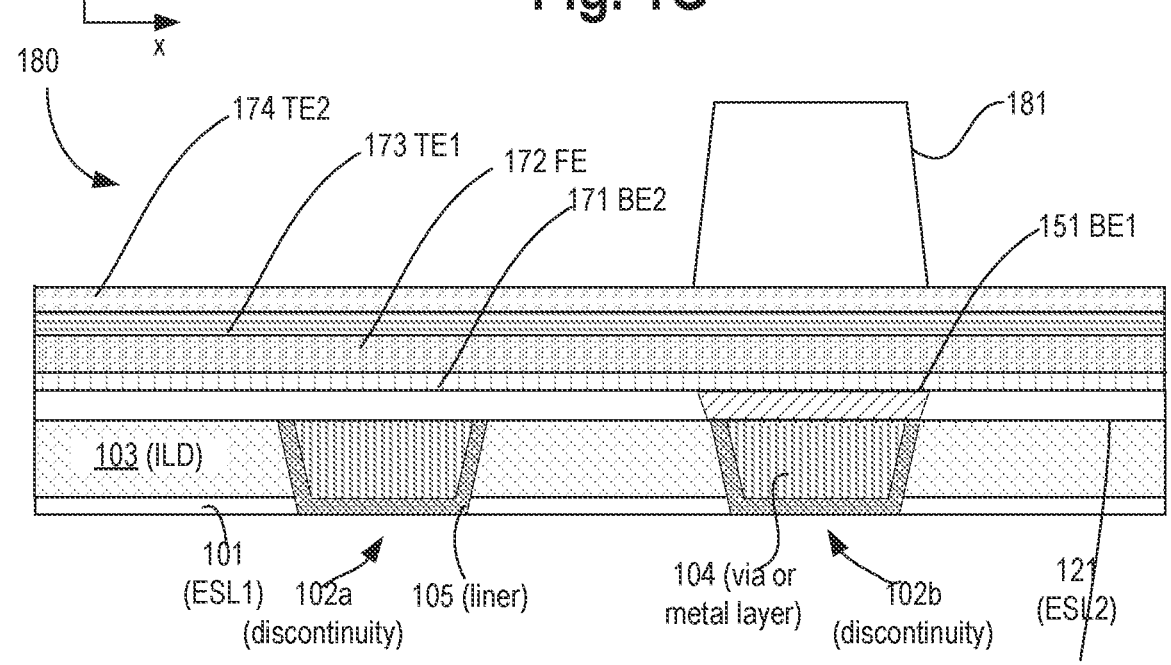
Figure 1I:
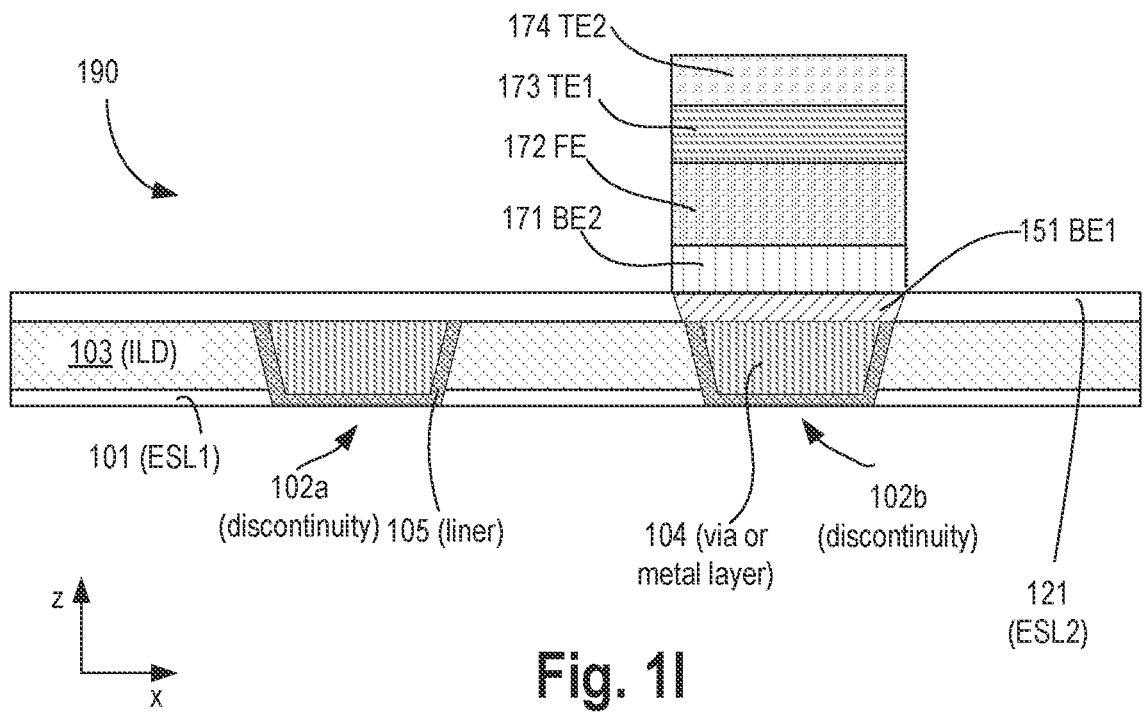
Figure 1J:
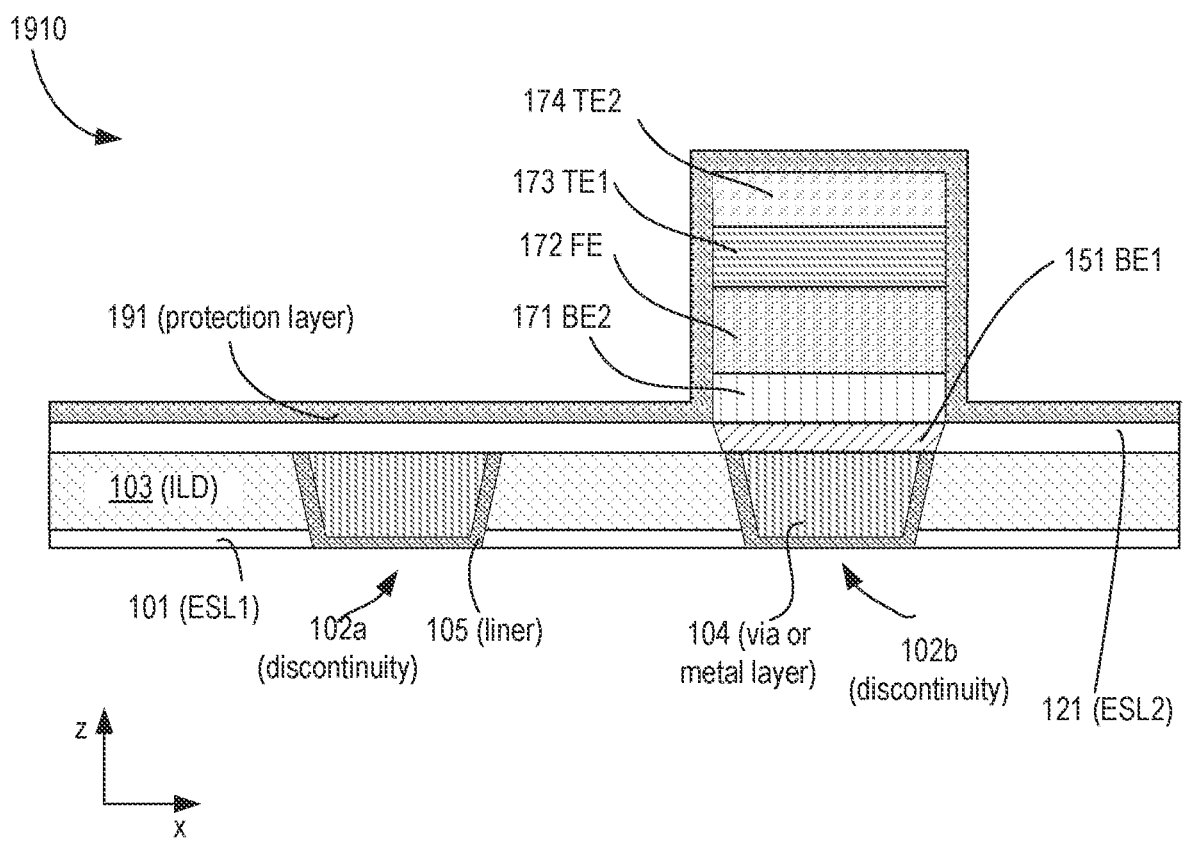
Figure 1K:
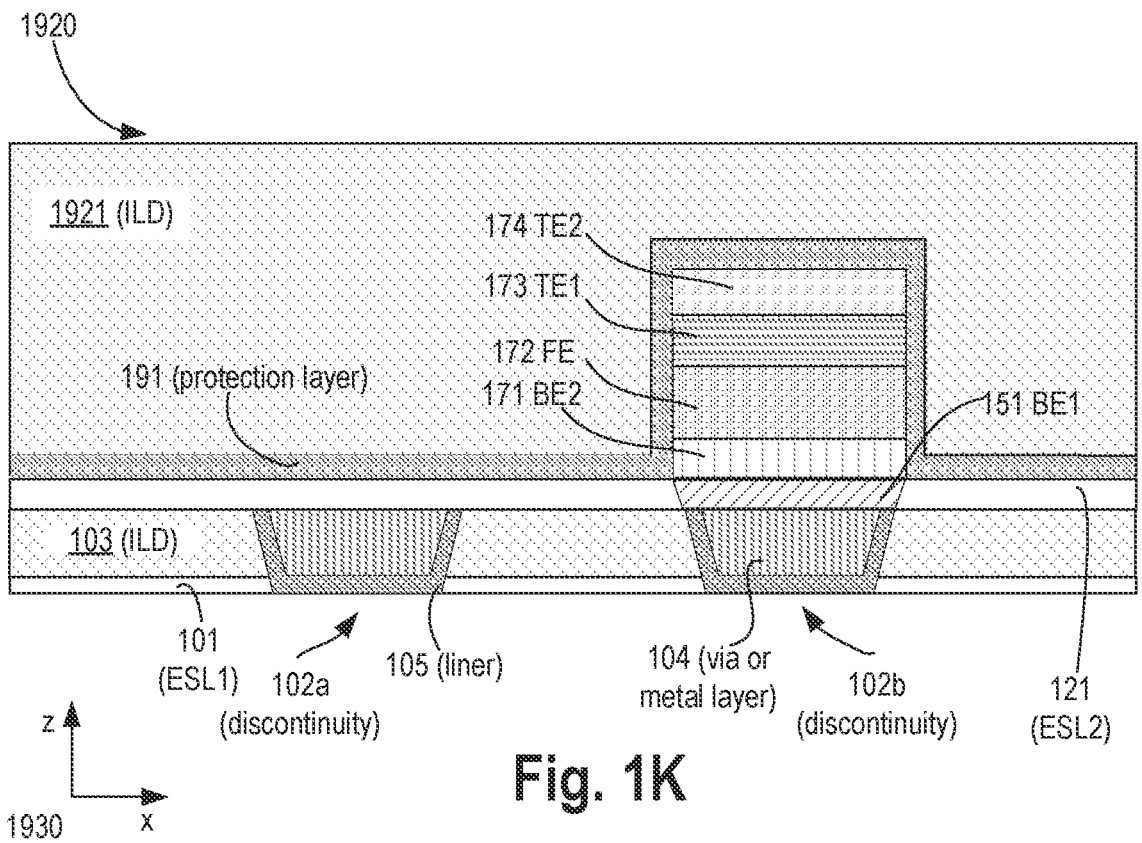
Figure 1L:
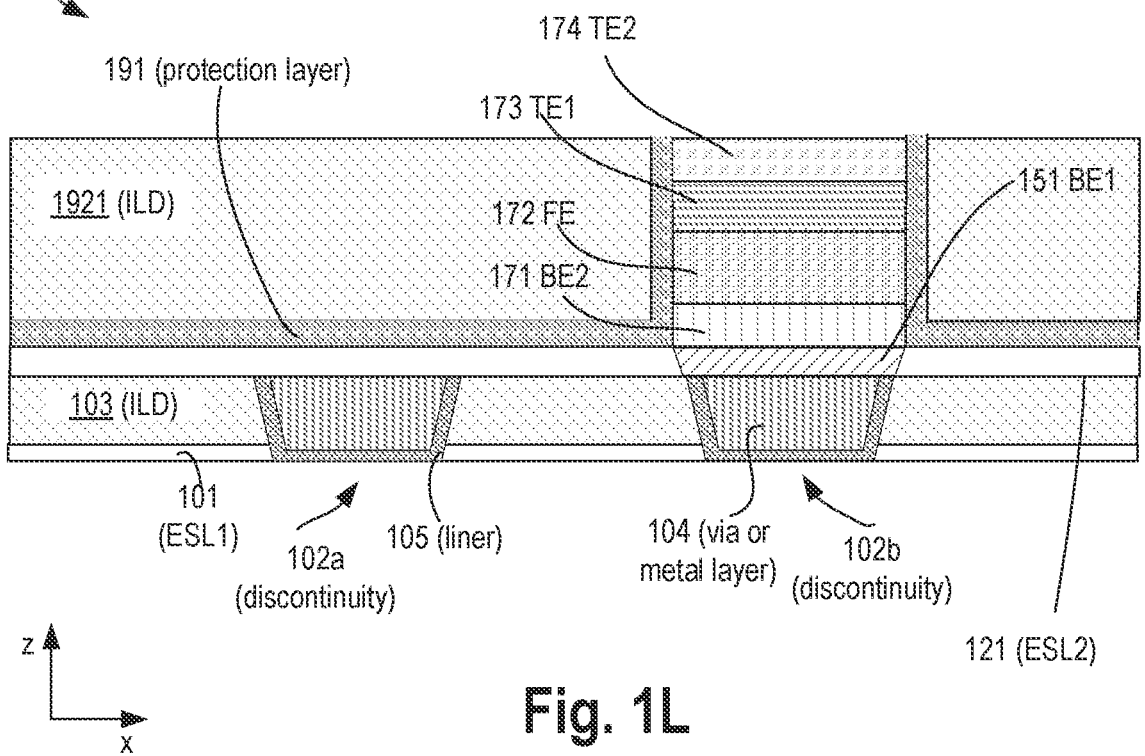
Figure 1M:
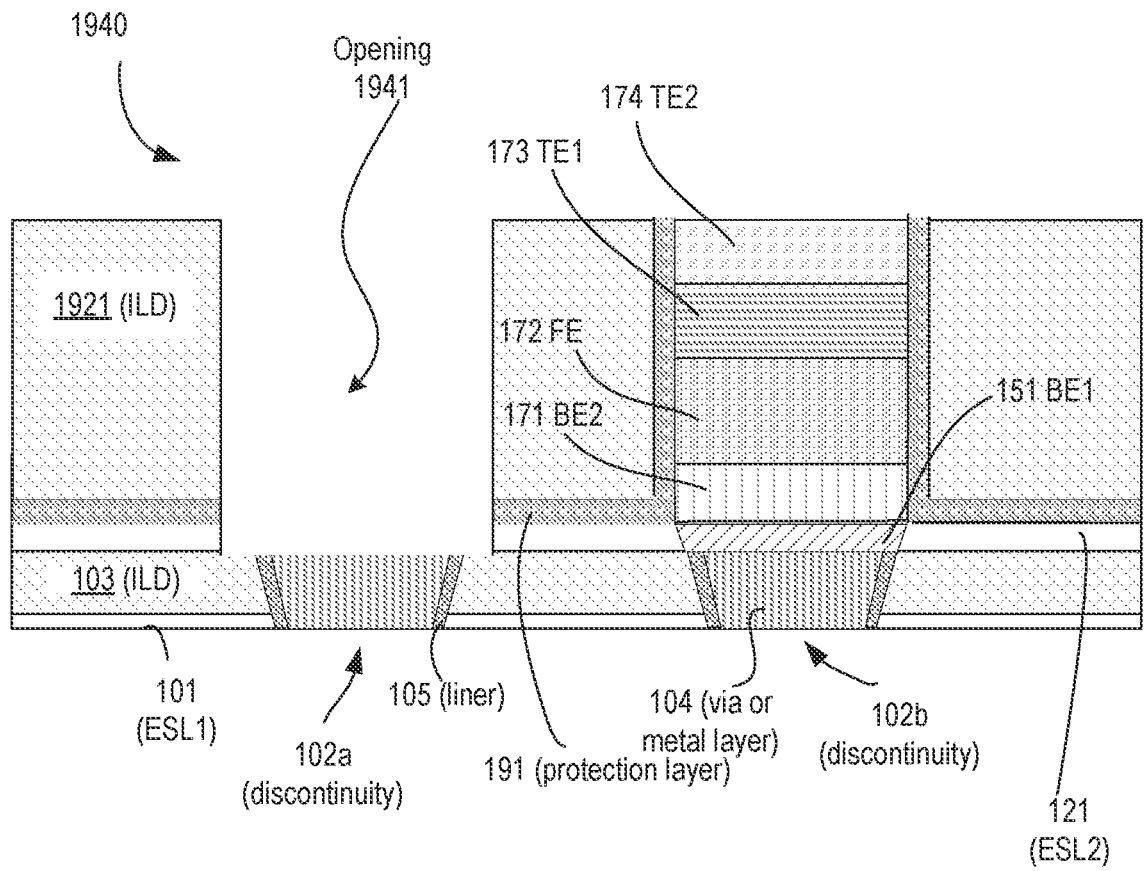

Some embodiments describe a ferroelectric capacitor and method of fabricating or patterning such, and integrating with a transistor. The method comprises forming a first etch stop layer (ESL) with at least first and second discontinuities. These discontinuities are used to connect to a transistor and a ferroelectric capacitor. The method further comprises depositing a first interlayer dielectric (ILD) over the first ESL, wherein the first ILD has at least first and second discontinuities substantially aligned with the first and second discontinuities of the first ESL. The method comprises depositing liners on sidewalls of the first and second discontinuities of the first ILD, wherein the first and second discontinuities of the first ILD include fill metal between the liners on the sidewalls. The liners encapsulate the sidewalls of respective vias. The method comprises depositing a second ESL over the first ILD, wherein the second ESL includes a first discontinuity and a second discontinuity, wherein the first discontinuity of the second ESL is substantially aligned with the first discontinuities of the first ESL and first IDL. The process of fabricating the FE memory cell now begins. The method comprises separating a first structure, for the ferroelectric (FE) memory cell, from regular logic with a first lithographic mask. The regular logic may include an access transistor of a 1T-1C memory bit-cell, for example.

The method comprises etching the second ESL to expose a region for the first structure such that the first lithographic mask is stripped over the region for the first structure. The method then comprises forming the stack of layers for the ferroelectric capacitor. The method comprises depositing a first metal, of the FE memory cell, in the first discontinuity of second ESL. This first metal forms a first bottom electrode layer of the FE capacitor. The method comprises polishing the first metal up to the second ESL. Additional layers of the stack are then deposited. These layers include a second metal over the first metal, wherein the metal forms a pedestal, FE material over the second metal; a third metal over the FE material; and fourth metal over the third metal.

The second metal forms a second bottom electrode layer. The third metal forms a first top electrode, while the fourth metal forms a second top electrode. The method further comprises patterning the second metal, FE material, the third metal, and the fourth metal with a second lithographic mask. While two electrodes are assumed for the top electrode, any number of layers can be stacked to form a multi-layer top electrode. The same applies to the bottom electrode. For example, the top and/or bottom electrodes may comprise a single layer or multiple layers. The number of layers for the top and bottom electrodes may be the same or different. The second electrode is adjacent to the first electrode, the ferroelectric material is adjacent to the second electrode, the third electrode is adjacent to the ferroelectric material, and the fourth electrode is adjacent to the third electrode.

The method further comprises encapsulating with an encapsulation material the patterned second metal, FE material, third metal, and fourth metal, up to the polished first metal and the second ESL. The encapsulation material is conformably deposited such that the sidewalls of the ferroelectric stack are encapsulated by encapsulation material. The encapsulation material protects the FE capacitor stack as the integration process continues. The method further comprises depositing a second ILD over the encapsulated sidewalls of the second, third, and fourth metals and the FE material. The method comprises forming a second structure comprising a via substantially aligned with the second discontinuities of the first ESL, first ILD, and second ESL. The second ILD is then polished. A third ESL is then deposited over the polished ILD.

The fourth metal (second top electrode) is then coupled to a plate-line (PL) while the metal layer (e.g., fill metal) coupled to the first bottom electrode is coupled to a source/drain terminal of a transistor. The metal fill of the other discontinuity (where the FE structure is not formed) is coupled to a source/drain terminal of a transistor. The metal fill of this other discontinuity forms a via or is coupled to a metal layer which in turn couples to a bit-line (BL). The gate terminal of the transistor is coupled to word-line (WL).

There are many technical effects of various embodiments. For example, the process of forming the ferroelectric capacitor makes sure that ferroelectric capacitor is protected as it is integrated with a transistor. A memory bit-cell formed using the ferroelectric capacitor allows for very low voltage switching (e.g., 100 mV) of a ferroelectric (FE) state in the ferroelectric capacitor. The ferroelectric capacitor can be used with any type of transistor. For example, the ferroelectric capacitor of various embodiments can be used with planar or non-planar transistors. The transistors can be formed in the frontend or backend of a die. With multiple electrode layers, the memory bit-cell formed using the ferroelectric capacitor results in a taller and narrower bit-cell compared to traditional memory bit-cells. As such, more bit-cells can be packed in a die resulting in a higher density memory that can operate at lower voltages than traditional memories while providing the much sought after non-volatility behavior. In some embodiments, the memory bit-cells are formed in the frontend and backend to further increase the density of the memory per die. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

Figure 1N:
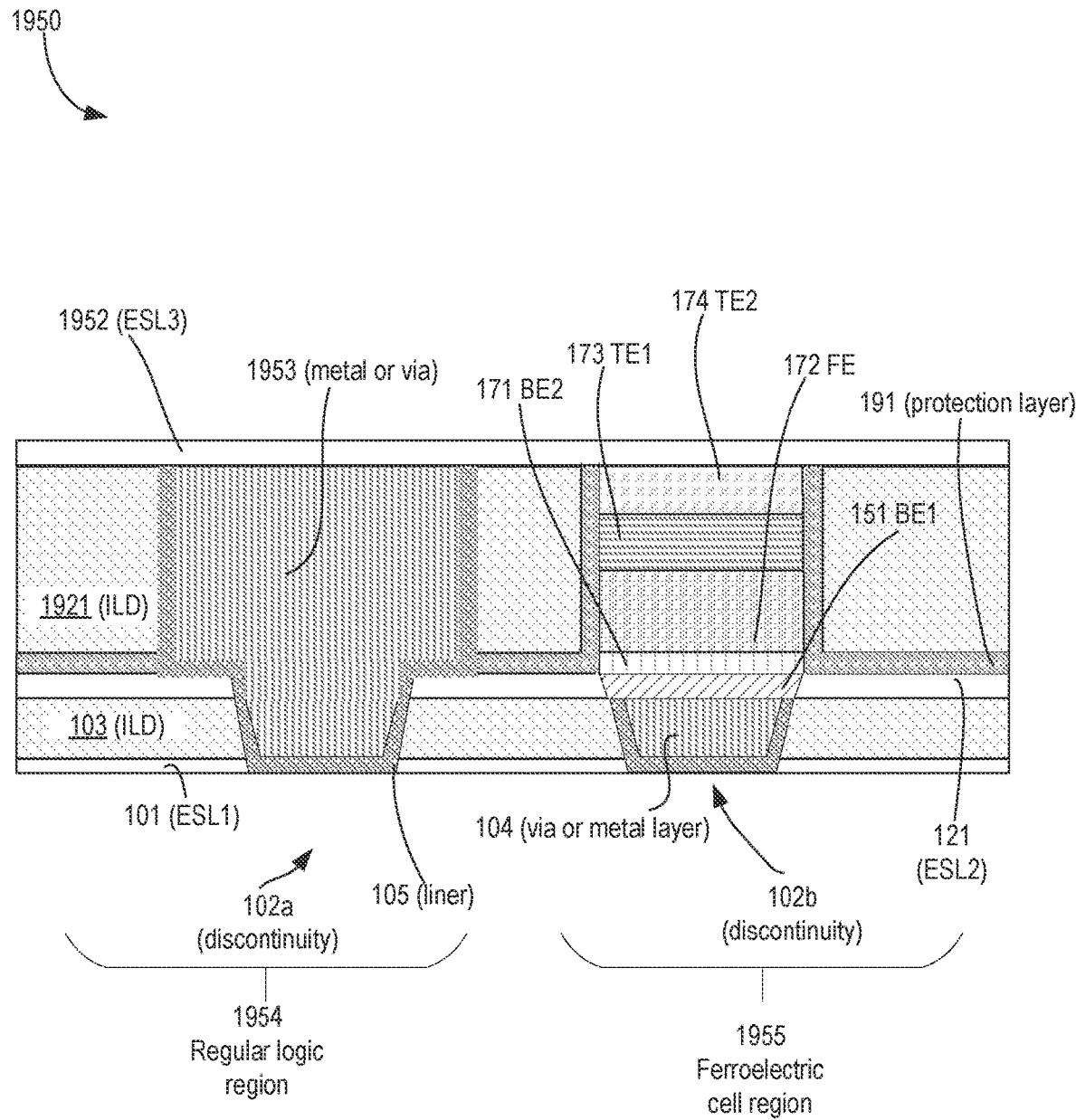

FIGS. 1A-N illustrate cross-sections 100, 120, 130, 140, 150, 160, 170, 180, 190, 1910, 1920, 1930, 1940, and 1950, respectively, of processes of patterning and integrating a ferroelectric capacitor with a transistor, in accordance with some embodiments. The process described herein assumes certain prior processes already performed. For example, active devices on or in a substrate may already be fabricated and vias and metal interconnect may already be fabricated for integrating to the structure described by the various processes.

Cross-section 100 illustrates a structure comprising a first etch stop layer (ESL) 101 with at least first and second discontinuities 102a and 102b. The structure further comprises a first interlayer dielectric (ILD) 103 over first ESL, wherein the first ILD has at least first and second discontinuities substantially aligned with the first and second discontinuities of the first ESL. The structure comprises liners 105 on sidewalls of the first and second discontinuities of the first ILD, wherein the first and second discontinuities of the first ILD include fill metal 104 between liners 105 on the sidewalls. In some embodiments, material for metal fill 104 includes one or more of: Co, W, Cu, Ag, Au, or Ru. In some embodiments, the material for liner 105 include TaN, TiN, Co, Ru, Ta, MgO, MgAlO, metal liner or a combination thereof. The thickness of the liner 105 in the x-direction and z-direction is in a range of 1 Angstrom (A) to 20A. One of the discontinuities is used for coupling to a ferroelectric (FE) capacitor stack of layers, and the other discontinuity is used for coupling to an active device (e.g., regulator logic, transistor, etc.).

ESL 101 may include any suitable material that has very different etch characteristics than material(s) for liner 105, and metal 104. In some embodiments, first ESL 101 comprises a material which includes one or more of: Si, C, or N. In some embodiments, first ESL 101 includes a material which is one of: SiCN, SiN, SiC, or SiON. In various embodiments, ILD 103 is a low-k dielectric material. The materials include one or more of: Si, Hf, Zr, or N. Example compounds of ILD 103 include SiO2, HfSiO4, or ZrSiO4. The top surface of the structure is then polished. For example, chemical mechanical polishing or planarization (CPM) is used to smooth the top surface with a combination of chemical and mechanical forces. The thickness of ESL (e.g. ESL1 101) is in a range of 10 Angstrom (A) to 500 A.

Cross-section 120 illustrates deposition of second ESL 121 over the polished top surface of the structure shown in FIG. 1A. The thickness of the second ESL 121 can be the same as that of ESL 101. In some embodiments, second ESL 121 comprises a material which includes one or more of: Si, C, or N. In various embodiments, second ESL 121 is one of: SiCN, SiN, SiC, or SiON.

Cross-section 130 illustrates forming and positioning a first lithographic mask 133 over second ESL 121 to separate the ferroelectric memory capacitor from regulator logic. Here, mask 133 has an opening where FE capacitor will be formed.

Cross-section 140 illustrates etching through ESL 121 to expose region for an FE structure such that first lithographic mask is stripped at opening 141 over the region for the first structure.

Cross-section 150 illustrates a fabrication point where first backend (BE1) material 151 is deposited over the etched ESL 121. BE1 material 151 conforms inside the etched region (e.g., first discontinuity of ESL 121).

Cross-section 160 illustrates a fabrication point where BE1 151 is polished down to ESL 121. The top surface of ESL 121 is polished using, for example, chemical mechanical polishing or planarization (CPM) to smooth the top surface of ESL 121 and BE1 151 with a combination of chemical and mechanical forces.

Cross-section 170 illustrates a fabrication point with a stack of layers for forming an FE capacitor. The stack of layers include bottom electrode material 171 (BE2) adjacent to ESL 121 and BE1 151; FE material 172 adjacent to BE2 171; first top electrode material (TE1) 173; and second top electrode material (TE2) 174. TE2 174 is adjacent to TE1 173. TE1 173 is adjacent to FE material 172.

The stack of layers are deposited using the techniques of physical vapor deposition (PVD), chemical vapor deposition (CVD), and/or atomic layer deposition (ALD). The deposition of these layers can be integrated or de-integrated. For example, BE1 151, BE2, 171, FE 172, TE1 173, and TE2 174 are deposited in the following sequence: BE1 151 and BE2 171 are deposited and then after an air break, FE 172 is deposited over BE2 171. TE1 173 is then deposited over FE 172 after an air break. In some embodiments, BE1 151, BE2 171, FE 172, TE1 173, and TE2 174 are deposited in the following sequence; BE1 151 and BE2 171 are deposited and then without any air break, FE 172 is deposited over BE2 171. TE1 173 is then deposited over FE 172 without an air break. In some embodiments, to improve various film properties, the process of annealing is integrated with deposition of BE1 151, BE2 171, FE 172, TE1 173, and TE2 174. For example, BE1 151, BE2 171, FE 172, TE1 173, and TE2 174 are deposited in the following sequence: BE1 151 and BE2 171 are deposited and annealed and then without any air break, FE 172 is deposited over BE2 171 and annealed. TE1 173 is then deposited over FE 172 without an air break and annealed.

Film properties include one or more of: adhesion, hermeticity, structure, resistance, ferroelectricity, reliability, etc. In this process BE1 151 and BE2 171 are deposited followed by annealing. Annealing is controlled at a ramp rate within a particular temperature range in the presence of certain materials. For example, annealing is performed at a controlled rate of 0.1 C/min (Celsius per minute), temperature range of 300 C to 900 C, and ambient N2, O2, NH3, N2O, Ar, or a combination thereof, for a time duration ranging from 1 ns to 30 minutes. Any suitable heat source can be used for annealing. For example, laser, lamp, or furnace can be used as the heat source.

While two layers for bottom electrode (BE) are shown (e.g., BE1 151 and BE2 171), any number of N layers can be used for forming the bottom electrode (BE), where N ranges from 1 to any suitable number. Similarly, while two layers for top electrode (TE) are shown (e.g., TE1 173 and TE2 174), any number of M layers can be used for the top electrode (TE), where M is in a range of 1 to any suitable number. In some embodiments, N is equal to M. In some embodiments, N is different from M. The thickness of each layer in the stack is in a range of 1 nm (nanometer) to 50 nm. For example, thickness $t_{BE1}$ of BE1 151, thickness $t_{BE2}$ of BE2 171, thickness $t_{FE}$ of FE 172, thickness $t_{TE1}$ of TE1 173, and thickness $t_{TE2}$ of TE2 174 along the z-axis is in a range of 1 nm to 50 nm.

In some embodiments, BE1 151, BE2 171, TE1 173, and TE2 174 comprise a metallic material, which includes one or more of: Ti, TiN, Ru, RuO2, IrO2, TaN, SrO, Ta, Cu, Co, W, WN, SrRuO3, or LaSrMnO3. In some embodiments, the electrodes directly adjacent to FE 172 comprise conductive oxides. In some embodiments, the conductive oxides are of the type AA'BB'O$_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability. The materials for the electrodes may be the same or different. For example, the material for TE1 173 is different from the material of TE2 174, and material for BE1 151 is different from the material for BE2 171, while materials BE1 151 and TE2 174 may be the same, and materials BE2 171 and TE1 173 may be the same. The materials for BE1 151, BE2 171, TE1 173, and TE2 174 can all be different from one another, in accordance with some embodiments. In some embodiments, BE 1511 and TE2 174 are made of different materials while BE2 171 and TE1 173 are of the same materials.

In various embodiments, FE material 172 can be any suitable low voltage FE material that allows the FE material to switch its state by a low voltage (e.g., 100 mV). In some embodiments, FE material 172 comprises a perovskite of the type ABO$_3$, where 'A' and 'B' are two cations of different sizes, and 'O' is oxygen which is an anion that bonds to both the cations. Generally, the size of A atoms is larger than the size of B atoms. In some embodiments, the perovskite can be doped (e.g., by La or Lanthanides). Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3 to 2%. For chemically substituted BiFeO3, BiCrO3, BiCoO3 class of materials, La or rate earth substitution into the Bi site can tune the spontaneous distortion. In some embodiments, FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, or LaNiO3.

In some embodiments, FE material 172 comprises a stack of layers including low voltage FE material between (or sandwiched between) conductive oxides. In various embodiments, when FE material 172 is a perovskite, the conductive oxides are of the type AA'BB'O$_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, FE material 172 comprises hexagonal ferroelectrics of the type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when FE material 172 comprises hexagonal ferroelectrics, the conductive oxides are of A2O3 (e.g., In2O3, Fe2O3) and ABO3 type, where 'A' is a rare earth element and B is Mn.

In some embodiments, FE material 172 comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 to 100. While various embodiments here are described with reference to ferroelectric material 172 for storing the charge state, the embodiments are also applicable for paraelectric material. For example, the capacitor of various embodiments can be formed using paraelectric material instead of ferroelectric material.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: SrTiO3, Ba(x)Sr(y)TiO3 (where x is −0.05, and y is 0.95), HfZrO2, Hf—Si—O, La-substituted PbTiO3, PMN-PT based relaxor ferroelectrics.

In some embodiments, FE material 172 comprises one or more of: Hafnium (Hf), Zirconium (Zr), Aluminum (Al), Silicon (Si), their oxides or their alloyed oxides. In some embodiments, FE material 172 includes one or more of: Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, FE material 172 includes one or more of: Bismuth ferrite (BFO), lead zirconate titanate (PZT), BFO with doping material, or PZT with doping material, wherein the doping material is one of Nb or La; and relaxor ferroelectrics such as PMN-PT.

In some embodiments, FE material 172 includes Bismuth ferrite (BFO), BFO with a doping material where in the doping material is one of Lanthanum, or any element from the lanthanide series of the periodic table. In some embodiments, FE material 172 includes lead zirconium titanate (PZT), or PZT with a doping material, wherein the doping material is one of La, Nb. In some embodiments, FE material 105 includes a relaxor ferro-electric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), Barium Titanium-Barium Strontium Titanium (BT-BST).

In some embodiments, FE material 172 includes Hafnium oxides of the form, $Hf_{1-x} E_x O_y$ where E can be Al, Ca, Ce, Dy, er, Gd, Ge, La, Sc, Si, Sr, Sn, or Y. In some embodiments, FE material 105 includes Niobate type compounds $LiNbO_3$, $LiTaO_3$, Lithium iron Tantalum Oxy Fluoride, Barium Strontium Niobate, Sodium Barium Niobate, or Potassium strontium niobate.

In some embodiments, FE material 172 comprises multiple layers. For example, alternating layers of [Bi2O2]2+, and pseudo-perovskite blocks (Bi4Ti3O12 and related Aurivillius phases), with perovskite layers that are n octahedral layers in thickness can be used.

In some embodiments, FE material 172 comprises organic material. For example, Polyvinylidene fluoride or polyvinylidene difluoride (PVDF).

Threshold in FE material 172 has a highly non-linear transfer function in the polarization vs. voltage response. The threshold is related to a) non-linearity of switching transfer function, and b) to the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of FE layer 172. A perfectly epitaxial, single crystalline FE layer will show higher squareness (e.g., ratio is closer to 1) compared to a poly crystalline FE. This perfect epitaxial can be accomplished by the use of lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, BE2 171 and TE1 173 are conductive oxides. In some embodiments, when metallic perovskite is used for FE material 172, conductive oxides can include one or more of: $IrO_2$, $RuO_2$, $PdO_2$, $OsO_2$, or $ReO_3$. In some embodiments, the perovskite is doped with La or Lanthanides. In some embodiments, thin layer (e.g., approximately 10 nm) perovskite template conductors such as SrRuO3 coated on top of IrO2, RuO2, PdO2, PtO2, which have a non-perovskite structure but higher conductivity to provide a seed or template for the growth of pure perovskite ferroelectric at low temperatures, are used as conductive oxides for BE2 171 and TE1 173.

In some embodiments, BE2 171 and TE1 173 are perovskite templated conductors. In such a templated structure, a thin layer (e.g., approximately 10 nm) of a perovskite conductor (such as SrRuO3) is coated on top of IrO2, RuO2, PdO2, or PtO2 (which have a non-perovskite structure but higher conductivity) to provide a seed or template for the growth of pure perovskite ferroelectric at low temperatures. In some embodiments, when ferroelectric 172 comprises hexagonal ferroelectric material, BE2 171 and TE1 173 can have hexagonal metals, spinels, or cubic metals. Examples of hexagonal metals include: PtCoO2, PdCoO2, and other delafossite structured hexagonal metallic oxides such as Al-doped ZnO. Examples of spinels include Fe3O4 and LiV2O4. Examples of cubic metals include Indium Tin Oxide (ITO) such as Sn-doped In2O3.

Cross-section 180 illustrates a fabricating point where a second lithographic mask 181 is placed are over TE2 174 to pattern BE 171, FE 172, TE1 173, and TE2 174. Mask 181 specifies the contours of the FE capacitor stack.

Cross-section 190 illustrates a fabricating point where BE2 171, FE 172, TE1 173, and TE2 174 are etched with reference to mask 181 to form a pillar structure, where BE1 151 forms a pedestal. Any suitable vertical etching process may be used. For example, dry etch, wet etch, plasma etch, or reactive ion etching may be used to etch BE2 171, FE 172, TE1 173, and TE2 174.

Cross-section 1910 illustrates a fabricating point after an encapsulation material 191 is conformably deposited over the patterned BE2 171, FE 172, TE1 173, and TE2 174, up to the polished BE2 171 and the second ESL 121. Encapsulation material 191 behaves as a protective layer that protects the integration of FE structure with logic devices. In some embodiments, encapsulation layer 191 comprises one or more of: Si, C, or N. In some embodiments, encapsulation layer 191 comprises: SiO2, SiCN, SiN, Al2O3, or HfO2. SiO2, and SiN can be deposited by PVD (physical vapor deposition). The thickness of encapsulation layer 191 is in a range of 10 A to 200 A.

In some embodiments, the etching process of cross-section 190 and the deposition of encapsulation layer 191 of cross-section 1910 are integrated to prevent any air exposure. In various embodiments, the deposition of encapsulation material 191 is hydrogen free to avoid chemical impact or drifts to FE layer 172.

Cross-section 1920 illustrates a fabricating point after deposition of ILD 1921 over protection layer 191. IDL 1921 provides structural integrity to the FE capacitor stack. In various embodiments, ILD 1921 is a low-k material to reduce capacitance between metal lines. The materials for ILD 1921 include one or more of: Si, Hf, Zr, or N. Examples compounds of ILD 1921 include SiO2, HfSiO4, or ZrSiO4.

Cross-section 1930 illustrates a fabricating point after polishing the top surface of ILD 1921 such that top layer of encapsulation layer 191 (along the x-axis and on top of TE2 174) is removed. A CPM process can be used for polishing.

Cross-section 1940 illustrates a fabricating point after a region for a second structure is fabricated substantially over the second discontinuity 102b. A person skilled in the art would appreciate that a lithographic mask followed by an etching process is used to cave out opening 1941.

Cross-section 1950 illustrates the fabricating point after liner 105 and metal 1953 is deposited in opening 1941. The second structure comprising via 1953 is substantially aligned with the first discontinuity 102a of the first ESL 101, first ILD 103, and second ESL 121. The top surface of metal 1953, second ILD 1921, and TE2 174 is polished. Another ESL 1952 (or third ESL 1952) is then deposited over the polished surface. As such, regions 1954 for regular logic and region 1955 for an FE cell are integrated in a single die.

Figure 2:
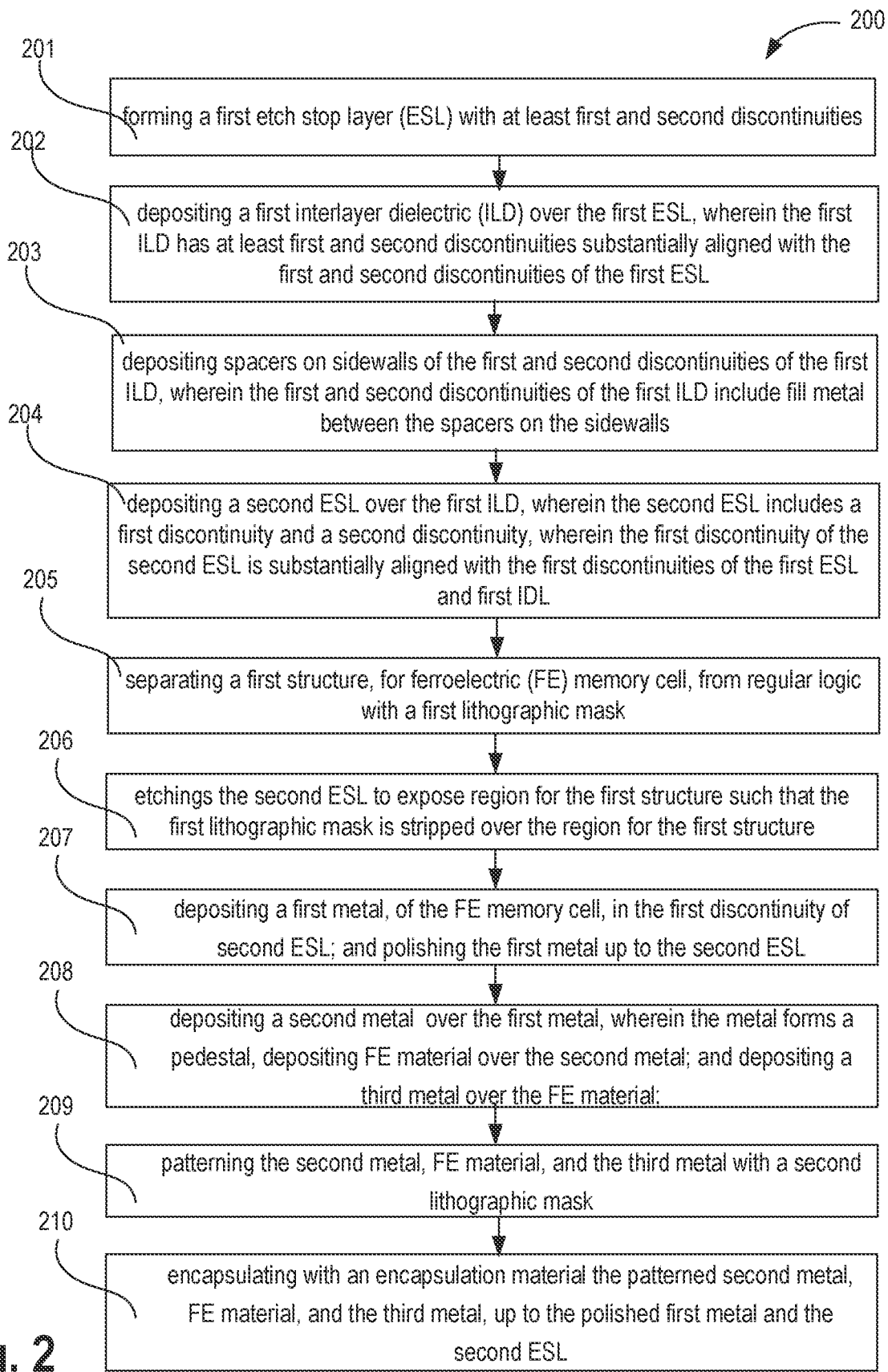
FIG. 2 illustrates a flowchart of a method of patterning and integrating a ferroelectric capacitor with a transistor, in accordance with some embodiments.

FIG. 2 illustrates flowchart 200 of a method of patterning and integrating a ferroelectric capacitor with a transistor, in accordance with some embodiments. Flowchart 200 illustrates the method described with reference to cross-sections of FIGS. 1A-N.

At block 201, the method comprises forming a first etch stop layer (ESL) 101 with at least first 102a and second 102b discontinuities. These discontinuities are used to connect to a transistor and a ferroelectric capacitor, respectively. At block 202, the method comprises depositing a first interlayer dielectric (ILD) 103 over first ESL 101, wherein the first ILD 103 has at least first and second discontinuities substantially aligned with the first and second discontinuities (102a and 102b, respectively) of first ESL 101. At block 203, the method comprises depositing liners 105 on sidewalls of the first and second discontinuities (102a and 102b, respectively) of the first ILD 103, wherein the first and second discontinuities of the first ILD include fill metal 104 between the liners 105 on the sidewalls. The liners are liners that encapsulate the sidewalls of respective vias.

At block 204, the method comprises depositing a second ESL 121 over the first ILD 103, wherein the second ESL 121 includes a first discontinuity and a second discontinuity, wherein the first discontinuity of the second ESL 121 is substantially aligned with the first discontinuities of the first ESL 101 and first ILD 103. The process of fabricating the FE memory cell now begins.

At block 205, the method comprises separating a region 141 for a first structure, for the ferroelectric (FE) memory cell, from regular logic with a first lithographic mask 133. The regular logic may include an access transistor of a 1T-1C memory bit-cell, for example.

At block 206, the method comprises etching the second ESL 121 to expose opening region 141 for the first structure such that the first lithographic mask 133 is stripped over the region for the first structure.

At block 207, the method then comprises forming the stack of layers for the ferroelectric capacitor. The method comprises depositing a first metal BE1 151, of the FE memory cell, in the second discontinuity 102b of second ESL 121. This first metal forms a first backend electrode layer (BE1 151) of the FE capacitor. The method comprises polishing the first metal up to the second ESL 121.

At block 208, additional layers of the stack are then deposited. These layers include a second metal BE2 171 over the first metal BE1 151, wherein the metal BE1 151 forms a pedestal, FE material 172 over the second metal BE2 171; a third metal TE1 173 over the FE material 172; and fourth metal TE2 174 over the third metal TE1 173. The second metal forms a second back electrode layer. The third metal forms a first top electrode, while the fourth metal forms a second top electrode.

At block 209, the method comprises patterning the second metal BE2 171, FE material 172, the third metal TE1 173, and the fourth metal TE2 174 with a second lithographic mask 181. While two electrodes are assumed for the top electrode, any number of layers can be stacked to form a multi-layer top electrode. The same applies to the bottom electrode. For example, the top and/or bottom electrodes may comprise a single layer or multiple layers. The number of layers for the top and bottom electrodes may be the same or different. The second electrode is adjacent to the first electrode, the ferroelectric material is adjacent to the second electrode, the third electrode is adjacent to the ferroelectric material, and the fourth electrode is adjacent to the third electrode.

At block 210, the method comprises encapsulating with an encapsulation material 191 the patterned second metal BE2 171, FE material 172, third metal TE1 173, and fourth BE2 TE2 174, up to the polished first metal BE1 151 and the second ESL 121. The encapsulation material 191 is conformably deposited such that the sidewalls of the ferroelectric stack are encapsulated by encapsulation material. The encapsulation material 191 protects FE stack as the integration process continues.

The method further comprises depositing a second ILD 1921 over the encapsulated sidewalls of the second BE2 171, third TE1 173, and fourth TE2 174 metals and the FE material 172. The method comprises forming a second structure in opening region 1941 comprising a via 1953 substantially aligned with the second discontinues 102b of the first ESL 101, first ILD 103, and second ESL 121. The second ILD 1921 is then polished. A third ESL 1952 is then deposited over the polished ILD 1921.

The fourth metal (second top electrode) is then coupled to a plate-line (PL) while the metal layer (e.g., fill metal) coupled to the first bottom electrode is coupled to a source/drain terminal of a transistor. The metal fill of the other discontinuity (where the FE structure is not formed) is coupled to a source/drain terminal of a transistor. The metal fill of this other discontinuity forms a via or is coupled to a metal layer which in turn couples to a bit-line (BL). The gate terminal of the transistor is coupled to word-line (WL).

Figure 3A:
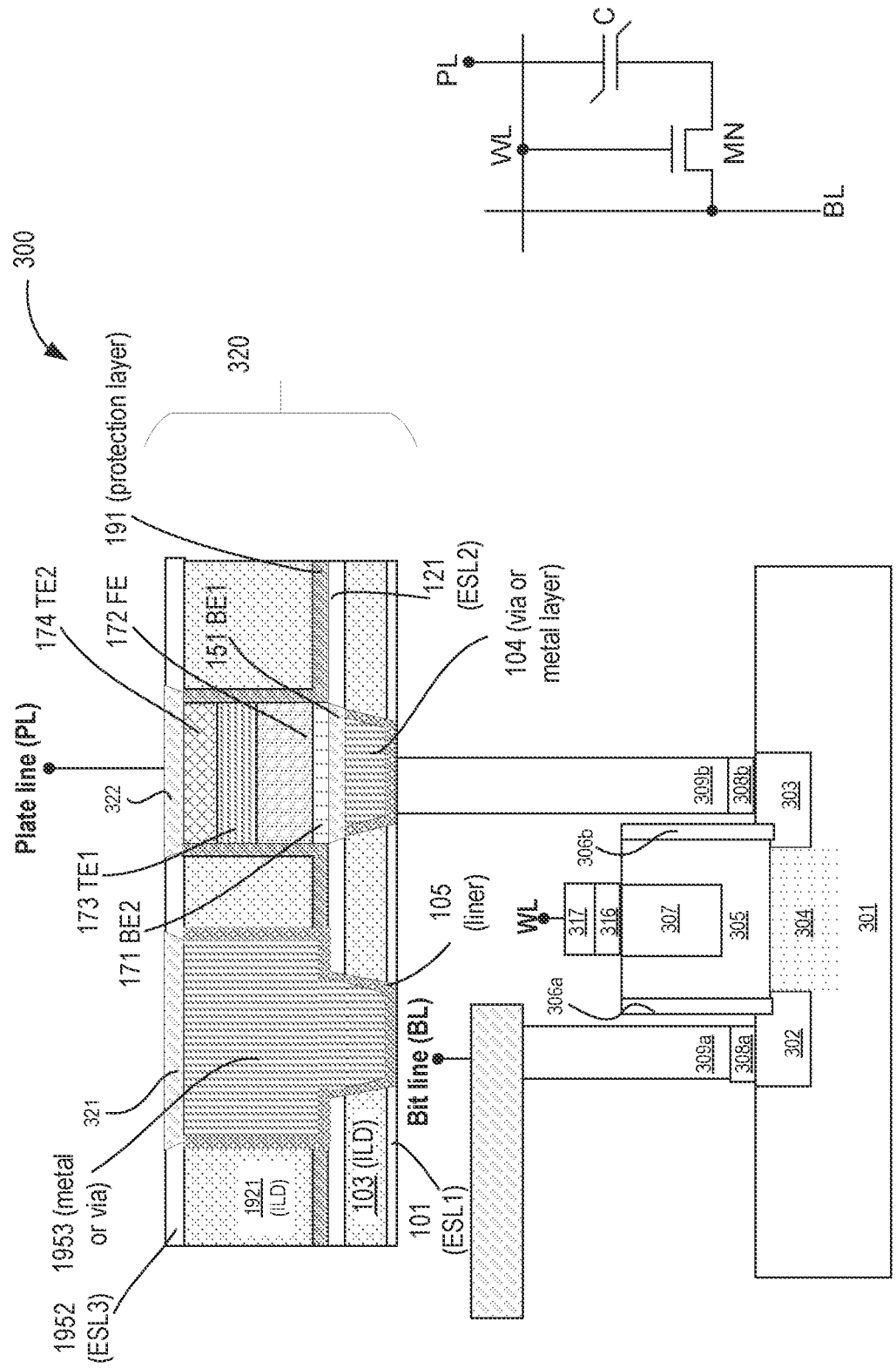
FIGS. 3A-B illustrate 1T-1C memory bit-cells comprising the ferroelectric capacitor of various embodiments.
Figure 3B:
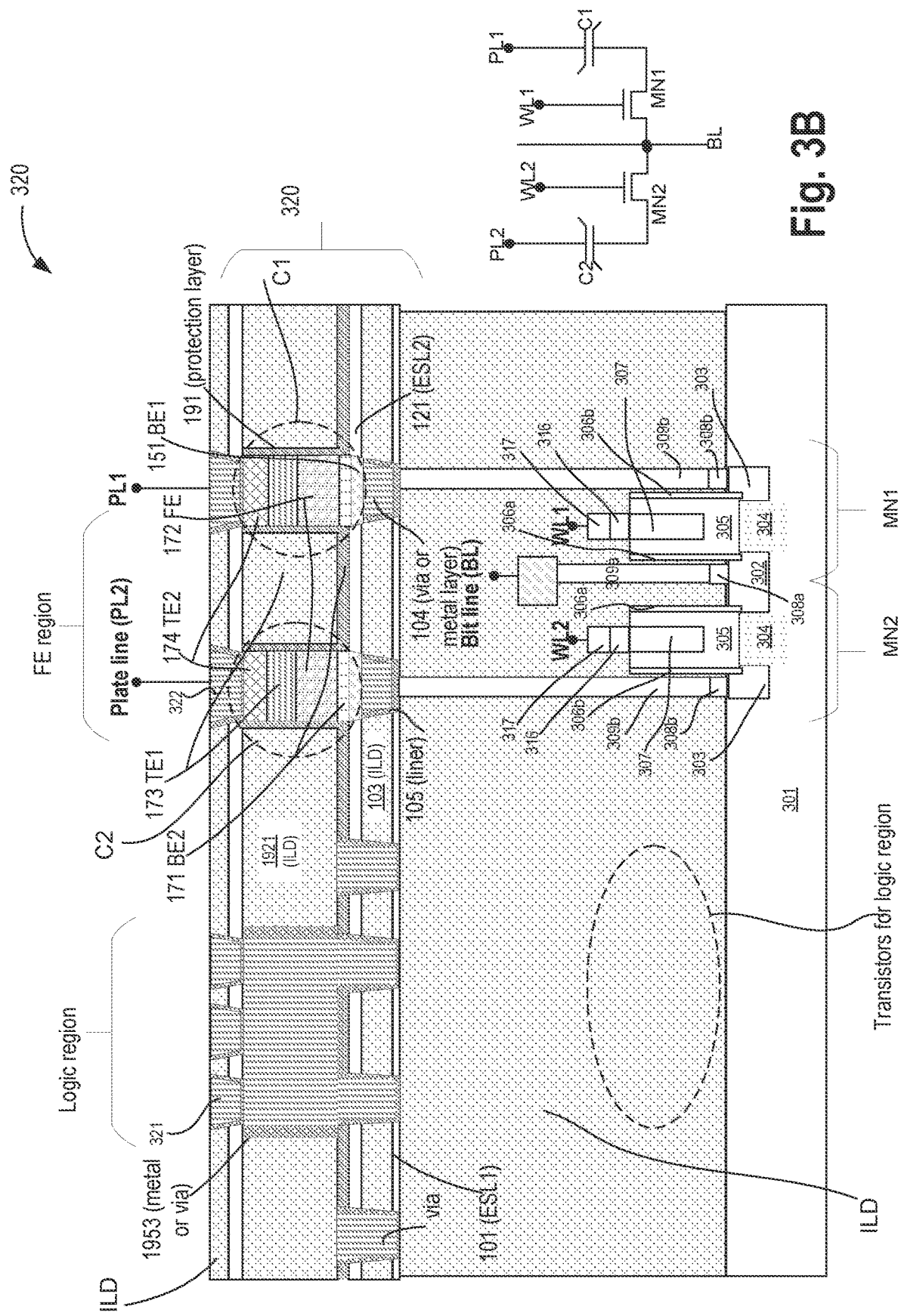

FIGS. 3A-B illustrate 1T-1C (one transistor, one capacitor) bit-cells 300 and 320 comprising the ferroelectric capacitor off various embodiments. Memory cell 300 is one practical use of FE structure 320 formed using the various processes described with reference to FIGS. 1A-N and FIG. 2. Here, one-transistor, one-capacitor (1T-1C) device is illustrated. In some embodiments, an n-type transistor MN1 is formed and is coupled to FE capacitor 320.

Transistors MN1 and MN2 (collectively referred to as MN) can be a planar or non-planar transistor. In some embodiments, transistor MN can be formed in the frontend or backend. In some embodiments, FE structure 320 is formed in the frontend or backend. While transistor MN is illustrated as an n-type transistor, it can be replaced with a p-type transistor. The transistor here can be Square Wire, Rectangular Ribbon Transistor, Gate All Around Cylindrical Transistor, Tunneling FET (TFET), ferroelectric FET (FeFETs), bi-polar (BJT), BiCMOS, or other devices implementing transistor functionality, for instance, carbon nanotubes or spintronic devices. In some embodiments, the transistor is a typical metal oxide semiconductor (MOS) transistor or its derivative including Tri-Gate and FinFET transistors. While MOSFET have symmetrical source and drain terminals, TFET device has asymmetric source and drain terminals.

Transistor MN is formed in/on substrate 301, and comprises source 302, drain 303, channel region 304, source contact 308a, drain contact 308b, and gate comprising gate dielectric 305, gate liners 306a and 306b; gate metal 307.

Substrate 301 includes a suitable semiconductor material such as: single crystal silicon, polycrystalline silicon and silicon on insulator (SOI). In one embodiment, substrate 301 includes other semiconductor materials such as: Si, Ge, SiGe, or a suitable group III-V or group III-N compound. The substrate 301 may also include semiconductor materials, metals, dopants, and other materials commonly found in semiconductor substrates.

In some embodiments, source region 302 and drain region 303 are formed within substrate 301 adjacent to the gate stack of the transistor. The source region 302 and drain region 303 are generally formed using either an etching/deposition process or an implantation/diffusion process.

In the etching/deposition process, substrate 301 may first be etched to form recesses at the locations of the source 302 and drain 303 regions. An epitaxial deposition process may then be carried out to fill the recesses with material that is used to fabricate the source region 302 and drain region 303. In the implantation/diffusion process, dopants such as boron, aluminum, antimony, phosphorous, or arsenic may be ion-implanted into the substrate to form the source region 302 and drain region 303. An annealing process that activates the dopants and causes them to diffuse further into substrate 301 typically follows the ion-implantation process.

In some embodiments, one or more layers of metal and/or metal alloys are used to form the source region 302 and drain region 303. In some embodiments, source region 302 and drain region 303 are formed using one or more alternate semiconductor materials such as germanium or a suitable group III-V compound. In some embodiments, source region 302 and drain region 303 are fabricated using a silicon alloy such as silicon germanium or silicon carbide. In some embodiments, the epitaxially deposited silicon alloy is doped in-situ with dopants such as boron, arsenic, or phosphorous.

The semiconductor material for channel region 304 may have the same material as substrate 301, in accordance with some embodiments. In some embodiments, channel region 104 includes one of: Si, SiGe, Ge, and GaAs.

The gate dielectric layer 305 may include one layer or a stack of layers. The one or more layers may include high-k dielectric material, silicon oxide, and/or silicon dioxide (SiO$_2$). The high-k dielectric material may include elements such as: zinc, niobium, scandium, lean yttrium, hafnium, silicon, strontium, oxygen, barium, titanium, zirconium, tantalum, aluminum, and lanthanum. Examples of high-k materials that may be used in the gate dielectric layer include: lead zinc niobate, hafnium oxide, lead scandium tantalum oxide, hafnium silicon oxide, yttrium oxide, aluminum oxide, lanthanum oxide, barium strontium titanium oxide, lanthanum aluminum oxide, titanium oxide, zirconium oxide, tantalum oxide, and zirconium silicon oxide. In some embodiments, when a high-k material is used, an annealing process is used on the gate dielectric layer 305 to improve its quality.

In some embodiments, a pair of liner layers (sidewall liners) 306a/b are formed on opposing sides of the gate stack that bracket the gate stack. The pair of liner layers 306a/b are formed from a material such as: silicon oxynitride, silicon nitride, silicon nitride doped with carbon, or silicon carbide. Processes for forming sidewall liners are well-known in the art and generally include deposition and etching process operations. In some embodiments, a plurality of liner pairs may be used. For example, two pairs, three pairs, or four pairs of sidewall liners may be formed on opposing sides of the gate stack.

Gate metal layer 307 may comprise at least one P-type work-function metal or N-type work-function metal, depending on whether the transistor is to be a p-type or an n-type transistor. Gate metal layer 307 may comprise a stack of two or more metal layers, where one or more metal layers are work-function metal layers and at least one metal layer is a conductive fill layer.

For an n-type transistor, metals that may be used for the gate metal layer 307 include: aluminum carbide, tantalum carbide, zirconium carbide, and hafnium carbide. In some embodiments, metal for gate metal layer 307 for n-type transistor include: aluminum, hafnium, zirconium, titanium, tantalum, and their alloys. An n-type metal layer will enable the formation of an n-type gate metal layer 307 with a work function that is between about 3.9 eV and about 4.2 eV. In some embodiments, metal of layer 307 includes one of: TiN, TiSiN, TaN, Cu, Al, Au, W, TiSiN, or Co. In some embodiments, metal of layer 107 includes one or more of: Ti, N, Si, Ta, Cu, Al, Au, W, or Co.

For a p-type transistor, metals that are used for gate metal layer 307 include, but are not limited to, ruthenium, palladium, platinum, cobalt, nickel, and conductive metal oxides. An example of conductive oxide includes ruthenium oxide. A p-type metal layer will enable the formation of a p-type gate metal layer 307 with a work function that is between about 4.9 eV and about 5.2 eV.

The source contact 308b is coupled to via 309b, which is coupled to metal fill 104. Metal layer 104 of the via adjacent to the FE material stack is connected to any transistor or other interconnects. Plate-line (PL) via is coupled to metal contact 322 etched through ESL 1952. The drain contact 308a is coupled bit-line (BL). BL metal layer is below the FE material structure. Any suitable material can be used for drain and source contacts 308a/b and via 309a/b. For example, one or more of Ti, N, Si, Ta, Cu, Al, Au, W, or Co can be used for drain and source contacts 308a/b and via 309a/b. The gate electrode 307 of transistor MN1 may be connected to word-line (WL1) directly or through vias and metal layers 316 and 317, respectively. The gate electrode 307 of transistor MN2 is coupled to WL2. A plate-line (PL) is coupled to the FE structure through metal contact 322 etched through ESL3 1952. Here, PL1 is coupled to FE structure (C1) while PL2 is coupled to FE structure (C2). WL1 and WL2 are in parallel. BL is shared between MN1 and MN2. While Via 1953 is shown as a contiguous block, it can be broken into multiple vias over multiple layers to facilitate denser connection with regular logic transistors in logic region.

Figure 3C:
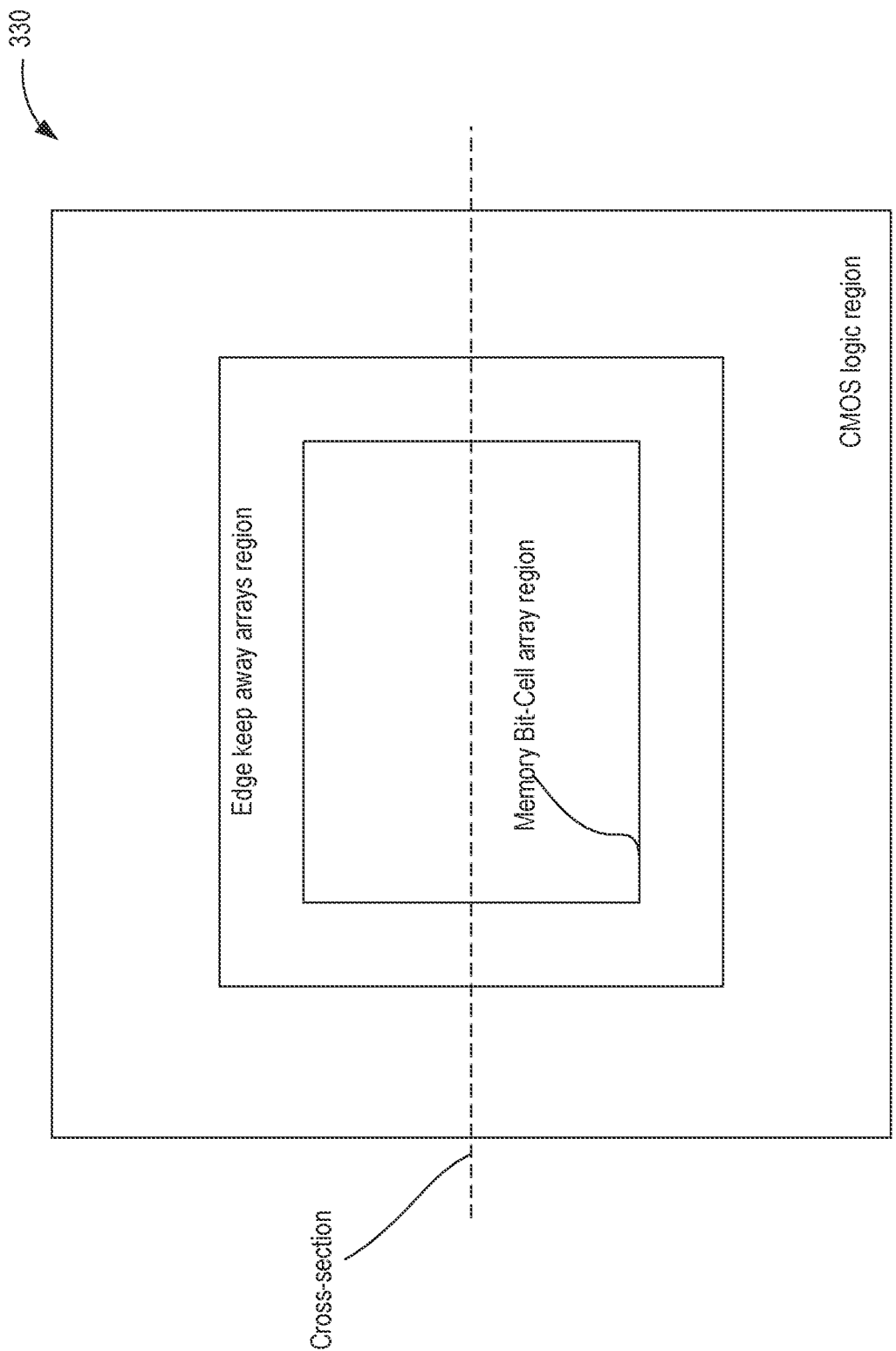
FIG. 3C illustrates a cross-section of the FIG. 3B, in accordance with some embodiments.

FIG. 3C illustrates cross-section 330 of the FIG. 3B, in accordance with some embodiments.

Figure 4:
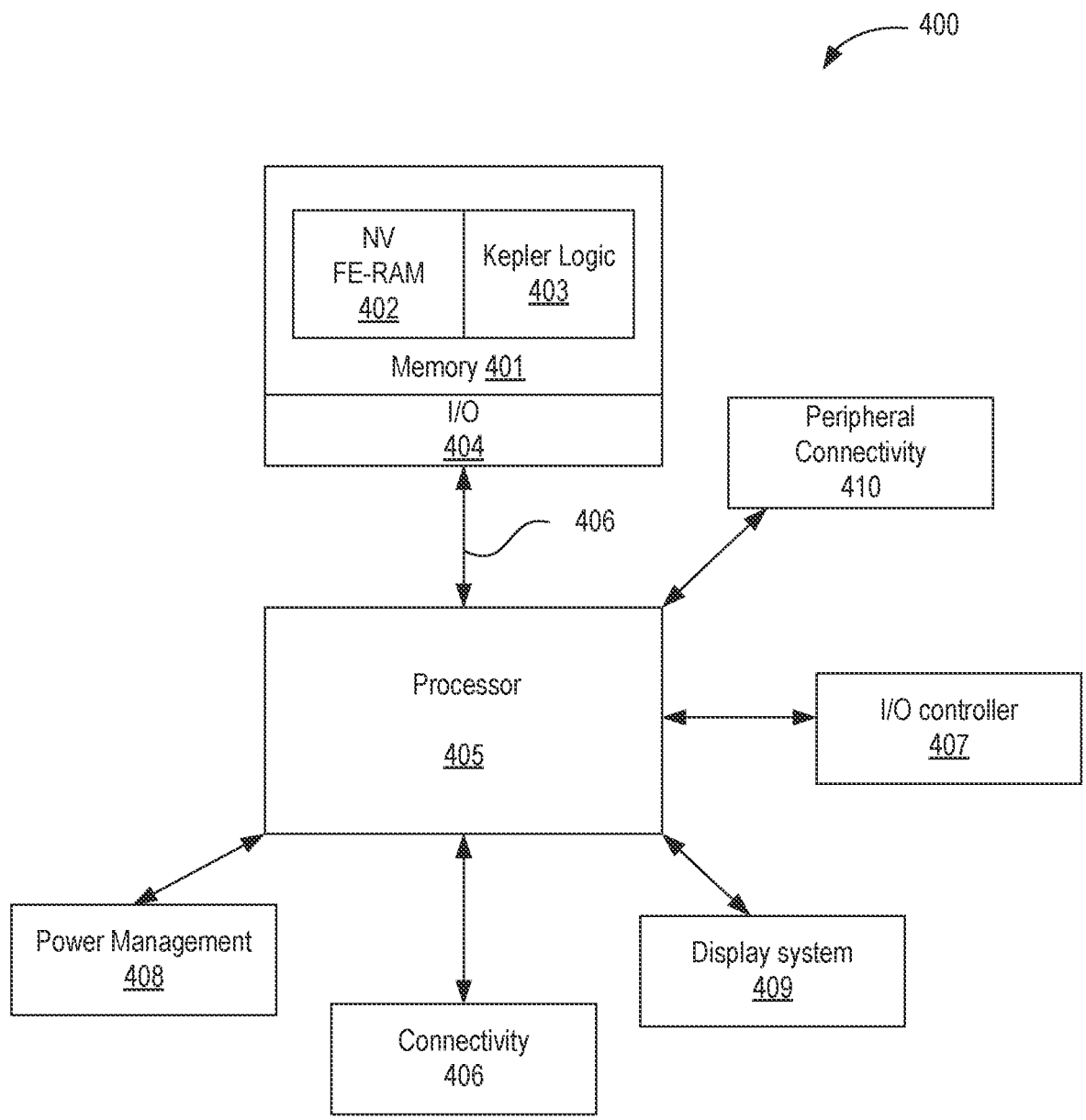
FIG. 4 illustrates a system-on-chip (SOC) including memory having an array of 1T-1C bit-cells and logic, in accordance with some embodiments.

FIG. 4 illustrates a system-on-chip (SOC) 400 including a memory chip having an array of 1T-1C bit-cells and logic, in accordance with some embodiments. SOC 400 comprises memory 401 having non-volatile (NV) ferroelectric random access memory (FE-RAM) array 402. Memory module 401 further comprises CMOS logic 403 such as decoders, multiplexers, and drivers to drive BL (bit-line), WL (word-line), PL (plate-line). Memory module 401 further includes an input-output (IO) interface 404, which is used to communicate with another device such as processor 405 via interconnect 406.

SOC further comprises a memory I/O (input-output) interface 404. The interface may be double-data rate (DDR) compliant interface or any other suitable interface to communicate with a processor. Processor 405 of SOC 400 can be a single core or multiple core processor. Processor 605 can be a general-purpose processor (CPU), a digital signal processor (DSP), or a application specific integrated circuit (ASIC) processor. In some embodiments, processor 405 is an artificial intelligence (AI) processor (e.g., a dedicated AI processor, a graphics processor configured as an AI processor).

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, AI processor 405 has reduced latency of computing the training model and using the training model, which reduces the power consumption of such AI processor systems.

Processor 405 may be coupled to a number of other chip-lets that can be on the same die as SOC 400 or on separate dies. These chip-lets include connectivity circuitry 406, I/O controller 407, power management 408, and display system 409, and peripheral connectivity 410.

Connectivity 406 represents hardware devices and software components for communicating with other devices. Connectivity 406 may support various connectivity circuitries and standards. For example, connectivity 406 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity 406 may support non-cellular standards such as WiFi.

I/O controller 407 represents hardware devices and software components related to interaction with a user. I/O controller 607 is operable to manage hardware that is part of an audio subsystem and/or display subsystem. For example, input through a microphone or other audio device can provide input or commands for one or more applications or functions of SOC 400. In some embodiments, I/O controller 407 illustrates a connection point for additional devices that connect to SOC 400 through which a user might interact with the system. For example, devices that can be attached to the SOC 400 might include microphone devices, speaker or stereo systems, video systems or other display devices, keyboard or keypad devices, or other I/O devices for use with specific applications such as card readers or other devices.

Power management 408 represents hardware or software that perform power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 408 may accordingly put such logic into low power state without the worry of losing data. Power management may select a power state according to Advanced Configuration and Power Interface (ACPI) specification for one or all components of SOC 400.

Display system 409 represents hardware (e.g., display devices) and software (e.g., drivers) components that provide a visual and/or tactile display for a user to interact with the processor 405. In some embodiments, display system 409 includes a touch screen (or touch pad) device that provides both output and input to a user. Display system 409 may include a display interface, which includes the particular screen or hardware device used to provide a display to a user. In some embodiments, the display interface includes logic separate from processor 405 to perform at least some processing related to the display.

Peripheral connectivity 410 may represent hardware devices and/or software devices for connecting to peripheral devices such as printers, chargers, cameras, etc. Peripheral connectivity 410 say support communication protocols, e.g., PCIe (Peripheral Component Interconnect Express), USB (Universal Serial Bus), Thunderbolt, High Definition Multimedia Interface (HDMI), Firewire, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided that illustrate the various embodiments. The examples can be combined with other examples. As such, various embodiments can be combined with other embodiments without changing the scope of the invention.

Example 1: An apparatus comprising: a first etch stop layer (ESL) with at least first and second discontinuities; a first interlayer dielectric (ILD) over the first ESL, wherein the first ILD has at least first and second discontinuities substantially aligned with the first and second discontinuities of the first ESL; liners on sidewalls of the first and second discontinuities of the first ILD, wherein the first and second discontinuities of the first ILD include fill metal between the liners on the sidewalls; a second ESL over the first ILD, wherein the second ESL includes a first discontinuity and a second discontinuity, wherein the first discontinuity of the second ESL is substantially aligned with the first discontinuities of the first ESL and first IDL; a first structure comprising: a first metal in the first discontinuity of second ESL; a second metal over the first metal; a ferroelectric (FE) material over the second metal; a third metal over the FE material; and an encapsulation material on sidewalls of the second and third metals and the FE material; a second structure comprising a via substantially aligned with the second discontinues of the first ESL, first ILD, and second ESL; a second ILD adjacent to the encapsulation material; and a third ESL over the encapsulation material.

Example 2: The apparatus of example 1, wherein the first, second, and third ESLs include one or more of: Si, C, or N.

Example 3: The apparatus of example 1, wherein the first metal, of the first structure, includes one or more of: Ti, Ru, Cu, Co, Ta, W, TaN, TiN, WN, SrRuO3, LaSrMnO3, IrO2, or Ir.

Example 4: The apparatus of example 1, wherein the second metal, of the first structure, includes one or more of: Ru, TaN, TiN, Pt, or SrO.

Example 5: The apparatus of claim 1, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La, Nb; a relaxor ferro-electric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), Barium Titanium-Barium Strontium Titanium (BT-BST); perovskite includes one of: BaTiO3, PbTiO3, KNbO3, NaTaO3, LaCoO3, SrCoO3, SrRuO3, LaMnO3, SrMnO3, YBa2Cu3O7, Bi2Sr2CaCu2O8, or LaNiO3; hexagonal ferroelectric includes one of: YMnO3, or LuFeO3; hexagonal ferroelectrics of a type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides of the form, Hf1-x Ex Oy where E can be Al, Ca, Ce, Dy, er, Gd, Ge, La, Sc, Si, Sr, Sn, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, Potassium strontium niobate; or improper ferroelectric includes one of: [PTO/STO]n or [LAO/STO]n, where 'n' is between 1 to 100.

Example 6: The apparatus of example 1, wherein the third metal of the first structure includes one or more of: Ti, Ru, Cu, Co, Ta, W, TaN, TiN, WN, SrRuO3, LaSrMnO3, IrO2, or Ir.

Example 7: The apparatus of example 1, wherein the liners, on the sidewalls of the first and second discontinuities of the first ILD, comprises TaN, TiN, Co, Ru, Ta, metal liner or a combination of thereof.

Example 8: The apparatus of example 1, wherein the fill metal includes one or more of: Co, W, Cu, or Ru.

Example 9: The apparatus of example 1, wherein the encapsulation material includes Si, C, or N.

Example 10: The apparatus of example 1 comprises a transistor coupled to the fill metal of the second discontinuity of the first IDL, wherein the transistor is over or in a substrate.

Example 11: A method of integrating a ferroelectric capacitor, the method comprising: forming a first etch stop layer (ESL) with at least first and second discontinuities; depositing a first interlayer dielectric (ILD) over the first ESL, wherein the first ILD has at least first and second discontinuities substantially aligned with the first and second discontinuities of the first ESL; depositing liners on sidewalls of the first and second discontinuities of the first ILD, wherein the first and second discontinuities of the first ILD include fill metal between the liners on the sidewalls; depositing a second ESL over the first ILD, wherein the second ESL includes a first discontinuity and a second discontinuity, wherein the first discontinuity of the second ESL is substantially aligned with the first discontinuities of the first ESL and first IDL; separating a first structure, for ferroelectric (FE) memory cell, from regular logic with a first lithographic mask; etchings the second ESL to expose region for a first structure such that the first lithographic mask is stripped over the region for the first structure; depositing a first metal, of the FE memory cell, in the first discontinuity of second ESL; polishing the first metal up to the second ESL; depositing a second metal, of the FE memory cell, over the first metal, wherein the metal forms a pedestal; depositing FE material over the second metal; depositing a third metal over the FE material; and patterning the second metal, FE material, and the third metal with a second lithographic mask.

Example 12: The method of example 11, further comprising: encapsulating with an encapsulation material the patterned second metal, FE material, and the third metal, up to the polished first metal and the second ESL; depositing a second ILD over the encapsulated sidewalls of the second and third metals and the FE material; forming a second structure comprising a via substantially aligned with the second discontinues of the first ESL, first ILD, and second ESL; polishing the second ILD; and depositing a third ESL over the polished ILD.

Example 13: The method of example 12, wherein the first, second, and third ESLs include one or more of: Si, C, or N.

Example 14: The method of example 12, wherein the first metal, of the first structure, includes one or more of: Ti, Ru, Cu, Co, Ta, W, TaN, TiN, WN, SrRuO3, LaSrMnO3, IrO2, or Ir.

Example 15: The method of example 12, wherein the second metal, of the first structure, includes one or more of: Ru, TaN, TiN, Pt, or SrO.

Example 16: The method of example 12, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La, Nb; a relaxor ferro-electric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, or NaTaO3; hexagonal ferroelectric includes one of: YMnO3, or LuFeO3; hexagonal ferroelectrics of a type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides of the form, Hf1-x Ex Oy where E can be Al, Ca, Ce, Dy, er, Gd, Ge, La, Sc, Si, Sr, Sn, Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 17: The method of example 12, wherein the third metal of the first structure includes one or more of: Ti, Ru, Cu, Co, Ta, W, TaN, TiN, WN, SrRuO3, LaSrMnO3, IrO2, or Ir.

Example 18: The method of example 12, wherein the liners, on the sidewalls of the first and second discontinuities of the first ILD, comprises TaN, TiN, Co, Ru, Ta, MgO, MgAlO, metal liner or a combination of thereof.

Example 19: The method of example 12, wherein the fill metal includes one or more of: Co, W, Cu, or Ru.

Example 20: The method of example 12, wherein the encapsulation material includes Si, C, or N.

Example 21: The method of example 12 comprises: forming a transistor, and coupling the transistor to the fill metal of the second discontinuity of the first IDL, wherein the transistor is over or in a substrate.

Example 22: A system comprising: a processor; a communication interface communicatively coupled to the processor; and a memory coupled to the processor, wherein the memory includes bit-cells, wherein one of the bit-cell includes: a first etch stop layer (ESL) with at least first and second discontinuities; a first interlayer dielectric (ILD) over the first ESL, wherein the first ILD has at least first and second discontinuities substantially aligned with the first and second discontinuities of the first ESL; liners on sidewalls of the first and second discontinuities of the first ILD, wherein the first and second discontinuities of the first ILD include fill metal between the liners on the sidewalls; a second ESL over the first ILD, wherein the second ESL includes a first discontinuity and a second discontinuity, wherein the first discontinuity of the second ESL is substantially aligned with the first discontinuities of the first ESL and first IDL; a first structure comprising: a first metal in the first discontinuity of second ESL; a second metal over the first metal; a ferroelectric (FE) material over the second metal; a third metal over the FE material; an encapsulation material on sidewalls of the second and third metals and the FE material; a second structure comprising a via substantially aligned with the second discontinuities of the first ESL, first ILD, and second ESL; a second ILD adjacent to the encapsulation material; and a third ESL over the encapsulation material.

Example 23: The system of example 22, wherein: the first, second, and third ESLs include one or more of: Si, C, or N; the first metal, of the first structure, includes one or more of: Ti, Ru, Cu, Co, Ta, W, TaN, TiN, or WN; the second metal, of the first structure, includes one or more of: Ru, TaN, TiN, Pt, or SrO; and the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La, Nb; a relaxor ferro-electric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, NaTaO3, LaCoO3, SrCoO3, or SrRuO3; hexagonal ferroelectric includes one of: YMnO3, or LuFeO3; hexagonal ferroelectrics of a type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides of the form, Hf1-x Ex Oy where E can be Al, Ca, Ce, Dy, er, Gd, Ge, La, Sc, Si, Sr, Sn, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 24: The system of example 22, wherein: the third metal of the first structure includes one or more of: Ti, Ru, Cu, Co, Ta, W, TaN, TiN, WN, SrRuO3, LaSrMnO3, IrO2, or Ir; and the liners, on the sidewalls of the first and second discontinuities of the first ILD, comprises TaN, TiN, Co, Ru, Ta, MgO, MgAlO, metal liner or a combination of thereof.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:
1. An apparatus comprising:
a transistor, comprising:
a source;
a drain;
a gate electrode between the source and the drain;
a drain contact coupled with the drain;
a source contact coupled with the source;
a gate contact coupled with the gate electrode; and
a first via coupled with the drain contact, wherein the apparatus further comprises:

a structure coupled to the first via, the structure comprising:
a first etch stop layer (ESL) with a first discontinuity;
an interlayer dielectric (ILD) over the first ESL, wherein the ILD comprises a second discontinuity, the second discontinuity substantially aligned with the first discontinuity;
a liner on first sidewalls of the first discontinuity and second discontinuity;
a second via electrically coupled with the first via, the second via comprising a fill metal between the liner on the first sidewalls;
a capacitor on at least a portion of the fill metal, the capacitor comprising:
a first bottom electrode in contact with the fill metal;
a second bottom electrode on the first bottom electrode;
a dielectric layer comprising a ferroelectric or a paraelectric material on the second bottom electrode;
a first top electrode on the dielectric layer; and
a second top electrode on the first top electrode, wherein the structure further comprises:
a second ESL on the ILD, the second ESL adjacent to the first bottom electrode;
an encapsulation material on second sidewalls of the capacitor; and
a metal contact on the second top electrode, wherein the apparatus further comprises:
a plate line coupled with the metal contact;
a word line coupled with the gate contact; and
a bit line coupled with a third via, wherein the third via is coupled with the source contact.

2. The apparatus of claim 1, wherein the dielectric layer includes one of:
Bismuth ferrite (BFO) with a doping material, wherein the doping material is one of Lanthanum, or elements from lanthanide series of periodic table;
Lead zirconium titanate (PZT) or PZT with a doping material, wherein the doping material is one of La or Nb;
a relaxor ferro-electric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST);
a perovskite which includes one of: BaTiO3, PbTiO3, KNbO3, or NaTaO3;
a hexagonal ferroelectric which includes one of: YMnO3 or LuFeO3;
hexagonal ferroelectrics of a type h-RMnO3, where R is a rare earth element including one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);
Hafnium (Hf), Zirconium (Zr), Aluminum (Al), Silicon (Si), their oxides or their alloyed oxides;
Hafnium oxides of a form, Hf1-x Ex Oy where E can be Al, Ca, Ce, Dy, Er, Gd, Ge, La, Sc, Si, Sr, Sn, or Y;
Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, and wherein 'x' or 'y' is a fraction;
Niobate type compounds LiNbO3, LiTaO3, Lithium iron Tantalum Oxy Fluoride, Barium Strontium Niobate, Sodium Barium Niobate, or Potassium strontium niobate; or
an improper ferroelectric which includes one of: [PTO/STO]n or [LAO/STO]n, where 'n' is between 1 to 100.

3. The apparatus of claim 1, wherein the encapsulation material is further on the second ESL.

4. The apparatus of claim 3, wherein the ILD is a first ILD and the apparatus further comprises a second ILD, and wherein the second ILD is adjacent to the encapsulation material on sidewall of the capacitor and on the encapsulation material that is on the second ESL.

5. The apparatus of claim 4, further comprising a third ESL on the second ILD and adjacent to the metal contact.

6. The apparatus of claim 5, wherein the first, second, and third ESLs include one or more of: Si, C, or N, and wherein the encapsulation material comprises a thickness in a range of 10 Angstrom to 200 Angstrom.

7. The apparatus of claim 1, wherein the liner is between the first via and the fill metal.

8. The apparatus of claim 1, wherein the first bottom electrode comprises one or more of: Ti, Ru, Cu, Co, Ta, W, TaN, TiN, WN, IrO2, or Ir and the second top electrode comprises one or more of: Ti, Ru, Cu, Co, Ta, W, TaN, TiN, WN, IrO2, or Ir.

9. The apparatus of claim 1, wherein the second bottom electrode comprises one of La-Sr-CoO3, SrRuO3, La-Sr-MnO3, YBa2Cu3O7, Bi2Sr2CaCu2O8, or LaNiO3, and the first top electrode comprises at least one of La-Sr-CoO3, SrRuO3, La-Sr-MnO3, YBa2Cu3O7, Bi2Sr2CaCu2O8, or LaNiO3.

10. An apparatus comprising:
a transistor within a ferroelectric cell region, the transistor comprising:
a source;
a drain;
a gate electrode between the source and the drain;
a drain contact coupled with the drain;
a source contact coupled with the source;
a gate contact coupled with the gate electrode; and
a first via coupled with the drain contact, wherein the apparatus further comprises:
a structure coupled to the first via, the structure comprising:
an etch stop layer (ESL) with a first discontinuity;
a first interlayer dielectric (ILD) over the ESL, wherein the first ILD comprises a second discontinuity, the second discontinuity substantially aligned with the first discontinuity;
a liner on first sidewalls of the first discontinuity and second discontinuity;
a second via electrically coupled with the first via, the second via comprising a fill metal between the liner on the first sidewalls;
a capacitor on at least a portion of the fill metal, the capacitor comprising:
a first bottom electrode in contact with the fill metal;
a second bottom electrode on the first bottom electrode;
a non-linear dielectric layer comprising a ferroelectric or a paraelectric material on the second bottom electrode;
a first top electrode on the non-linear dielectric layer; and
a second top electrode on the first top electrode, wherein the structure further comprises:

an encapsulation material comprising a first portion on second sidewalls of the capacitor;
a metal contact on the second top electrode; and
a plate line coupled with the metal contact;
a word line coupled with the gate contact, wherein the apparatus further comprises:
a bit line coupled with a third via, wherein the third via is coupled with the source contact; and
a second structure within a logic region, the second structure comprising,
a fourth via comprising the fill metal within a third discontinuity in the first etch stop layer (ESL) and within a fourth discontinuity in the first ILD; and
and a fifth via within a fifth discontinuity in a second ILD, wherein the fifth discontinuity is substantially aligned and over the fourth discontinuity, and wherein the second ILD is above the first ILD.

11. The apparatus of claim 10, wherein the non-linear dielectric layer includes one of:
Bismuth ferrite (BFO) with a doping material, wherein the doping material is one of Lanthanum, or elements from lanthanide series of periodic table;
Lead zirconium titanate (PZT), or PZT with a doping material, wherein the doping material is one of La or Nb;
a relaxor ferro-electric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST);
a perovskite which includes one of: BaTiO3, PbTiO3, KNbO3, or NaTaO3;
a hexagonal ferroelectric which includes one of: YMnO3 or LuFeO3;
hexagonal ferroelectrics of a type h-RMnO3, where R is a rare earth element including one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);
Hafnium (Hf), Zirconium (Zr), Aluminum (Al), Silicon (Si), their oxides or their alloyed oxides;
Hafnium oxides of a form, Hf1-x Ex Oy where E can be Al, Ca, Ce, Dy, Er, Gd, Ge, La, Sc, Si, Sr, Sn, or Y;
Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, and wherein 'x' or 'y' is a fraction;
Niobate type compounds LiNbO3, LiTaO3, Lithium iron Tantalum Oxy Fluoride, Barium Strontium Niobate, Sodium Barium Niobate, or Potassium strontium niobate; or
an improper ferroelectric which includes one of: [PTO/STO]n or [LAO/STO]n, where 'n' is between 1 to 100.

12. The apparatus of claim 10, wherein the liner is a first liner and the apparatus further comprises a second liner within third sidewalls of the third discontinuity, the fourth discontinuity and within the fifth discontinuity.

13. The apparatus of claim 12, wherein the second liner is between the fifth via and the second ILD, and wherein the first liner and the second liner comprise TaN, TiN, Co, Ru, Ta, MgO, MgAlO, or a combination of thereof.

14. The apparatus of claim 12, wherein the ESL is a first ESL and the apparatus further comprises a second ESL on the first ILD, the second ESL adjacent to the first bottom electrode and to the second liner.

15. The apparatus of claim 12, wherein the encapsulation material extends from the second sidewalls to the second liner, and wherein the encapsulation material is on the second ESL.

16. The apparatus of claim 10, wherein the second ESL comprises a vertical thickness that is substantially equal to vertical thickness of the first bottom electrode.

17. A system comprising:
a processor circuitry to execute one or more instructions;
a communication interface communicatively coupled to the processor circuitry; and
a memory to store the one or more instructions, wherein the processor circuitry or the memory includes an apparatus comprising:
a transistor, comprising:
a source;
a drain;
a gate electrode between the source and the drain;
a drain contact coupled with the drain;
a source contact coupled with the source;
a gate contact coupled with the gate electrode; and
a first via coupled with the drain contact, wherein the apparatus further comprises:
a structure coupled to the first via, the structure comprising:
a first etch stop layer (ESL) with a first discontinuity;
a first interlayer dielectric (ILD) over the ESL, wherein the first ILD comprises a second discontinuity, the second discontinuity substantially aligned with the first discontinuity;
a liner on first sidewalls of the first discontinuity and the second discontinuity;
a second via electrically coupled with the first via, the second via comprising a fill metal between the liner on the first sidewalls;
a capacitor on at least a portion of the fill metal, the capacitor comprising:
a first bottom electrode in contact with the fill metal;
a second bottom electrode on the first bottom electrode;
a dielectric layer comprising a ferroelectric or a paraelectric material on the second bottom electrode;
a first top electrode on the dielectric layer; and
a second top electrode on the first top electrode, wherein the structure furthe comprises:
a second ESL on the ILD, the second ESL adjacent to the first bottom electrode;
an encapsulation material on second sidewalls of the capacitor; and
a metal contact on the second top electrode, wherein apparatus further comprises:
a plate line coupled with the metal contact;
a word line coupled with the gate contact; and
a bit line coupled with a third via, wherein the third via is coupled with the source contact.

18. The system of claim 17, wherein the dielectric layer includes one of:
Bismuth ferrite (BFO) with a doping material, wherein the doping material is one of Lanthanum, or elements from lanthanide series of periodic table;
Lead zirconium titanate (PZT), or PZT with a doping material, wherein the doping material is one of La or Nb;

a relaxor ferro-electric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST);

a perovskite which includes one of: $BaTiO_3$, $PbTiO_3$, $KNbO_3$, or $NaTaO_3$;

a hexagonal ferroelectric which includes one of: $YMnO_3$ or $LuFeO_3$;

hexagonal ferroelectrics of a type h-$RMnO_3$, where R is a rare earth element including one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);

Hafnium (Hf), Zirconium (Zr), Aluminum (Al), Silicon (Si), their oxides or their alloyed oxides;

Hafnium oxides of a form, $Hf_{1-x} E_x O_y$ where E can be Al, Ca, Ce, Dy, Er, Gd, Ge, La, Sc, Si, Sr, Sn, or Y;

$Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, y doped $HfO_2$, where x includes one of: Al, Ca, Ce, Dy, Er, Gd, Ge, La, Sc, Si, Sr, Sn, or Y, and wherein 'x' or 'y' is a fraction;

Niobate type compounds $LiNbO_3$, $LiTaO_3$, Lithium iron Tantalum Oxy Fluoride, Bari Strontium Niobate, Sodium Barium Niobate, or Potassium strontium niobate; or an improper ferroelectric which includes one of: [PTO/STO]n or [LAO/STO]n, where 'n' is between 1 to 100, and wherein the liner, on the first sidewalls of the first discontinuity and second discontinuity, comprises TaN, TiN, Co, Ru, Ta, MgO, MgAlO or a combination of thereof.

19. The system of claim 17, wherein the first bottom electrode comprises one or more of: Ti, Ru, Cu, Co, Ta, W, TaN, TiN, WN, $IrO_2$, or Ir, wherein the second top electrode comprises one or more of: Ti, Ru, Cu, Co, Ta, W, TaN, TiN, WN, $IrO_2$, or Ir, wherein the second bottom electrode comprises one of La-Sr-$CoO_3$, $SrRuO_3$, La-Sr-$MnO_3$, $YBa_2Cu_3O_7$, $Bi_2Sr_2CaCu_2O_8$, or $LaNiO_3$, and wherein the first top electrode comprises at least one of La-Sr-$CoO_3$, $SrRuO_3$, La-Sr-$MnO_3$, $YBa_2Cu_3O_7$, $Bi_2Sr_2CaCu_2O_8$, or $LaNiO_3$.

* * * * *